United States Patent [19]

Murphy-Boesch et al.

[11] Patent Number: 5,194,811
[45] Date of Patent: Mar. 16, 1993

[54] RADIO FREQUENCY VOLUME RESONATOR FOR NUCLEAR MAGNETIC RESONANCE

[75] Inventors: Joseph Murphy-Boesch, Lafayette Hill; Ravi Srinivasan, Philadelphia, both of Pa.

[73] Assignee: Fox Chase Cancer Center, Philadelphia, Pa.

[21] Appl. No.: 561,898

[22] Filed: Aug. 2, 1990

[51] Int. Cl.$^5$ ............................................ G01R 33/20
[52] U.S. Cl. ...................................... 324/322; 324/318
[58] Field of Search .............. 324/309, 318, 322, 300, 324/307, 319, 320; 128/653.5

[56] References Cited

U.S. PATENT DOCUMENTS

| | | | |
|---|---|---|---|
| 4,646,024 | 2/1987 | Schenck et al. | 324/318 |
| 4,680,548 | 7/1987 | Edelstein et al. | 324/318 |
| 4,737,718 | 4/1988 | Kemner et al. | 324/322 |
| 4,740,752 | 4/1988 | Arakawa et al. | 324/318 |
| 4,783,641 | 11/1988 | Hayes et al. | 333/219 |
| 4,825,163 | 4/1989 | Yabusaki et al. | 324/318 |
| 4,879,515 | 11/1989 | Roemer et al. | 324/318 |
| 4,887,039 | 12/1989 | Roemer et al. | 324/318 |
| 4,929,881 | 5/1990 | Yabusaki et al. | 324/318 |
| 4,956,608 | 9/1990 | Dorri et al. | 324/319 |
| 4,992,737 | 2/1991 | Schnur | 324/318 |
| 5,041,790 | 8/1991 | Tropp et al. | 324/318 |
| 5,053,711 | 10/1991 | Hayes et al. | 324/318 |

FOREIGN PATENT DOCUMENTS

| | | | |
|---|---|---|---|
| 0303880 | 2/1989 | European Pat. Off. | |
| 293387 | 9/1988 | Japan | 324/318 |

OTHER PUBLICATIONS

D. I. Hoult and R. E. Richards, J. Magn. Resn. 54, 324–327 (1983) "The Signal-to-Noise Ratio of the Nuclear Magnetic Resonance Experiment".

Bottomley et al., Magn. Reson. Med. 7, 319–336 (1988) "Human in Vivo Phosphate Metabolite Imaging with $^{31}P$ NMR".

G. Isaac et al., J. Magn. Reson. 89, 41–50 (1990) "A Design for a Double-Tuned Birdcage Coil for Use in an Integrated MRI/MRS Examination".

Donald W. Alderman and David M. Grant, J. Magn. Reson. 36, 447–451 (1979) "An Efficient Decoupler Coil Design which Reduces Heating in Conductive Samples in Superconducting Spectrometers".

V. J. Sank, C. N. Chen and D. I. Hoult, J. Magn. Reson. 69, 236–242 (1986) "A Quadrature Coil for the Adult Human Head".

*Primary Examiner*—Michael J. Tokar
*Attorney, Agent, or Firm*—Dann, Dorfman, Herrell and Skillman

[57] ABSTRACT

A radio frequency volume resonator mounted on a dielectric support can be operated in quadrature at one or more NMR frequencies. The resonator consists of four axially distributed high frequency ring current paths on the dielectric support. At least four high frequency current paths interconnect each pair of adjacent ring paths. The ring segments with interconnecting segments form loops. At least one discrete capacitor is placed in each loop.

51 Claims, 12 Drawing Sheets

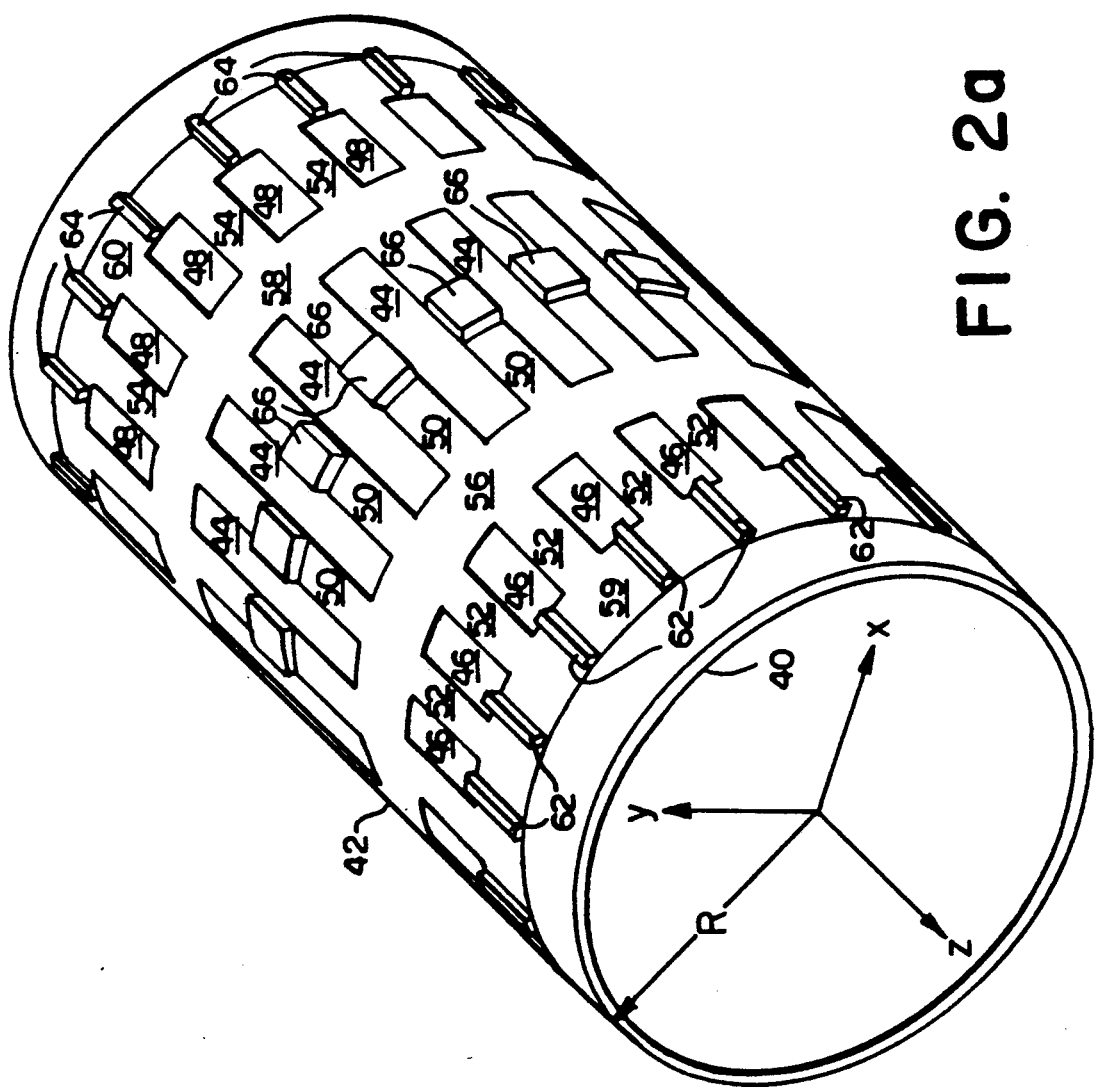

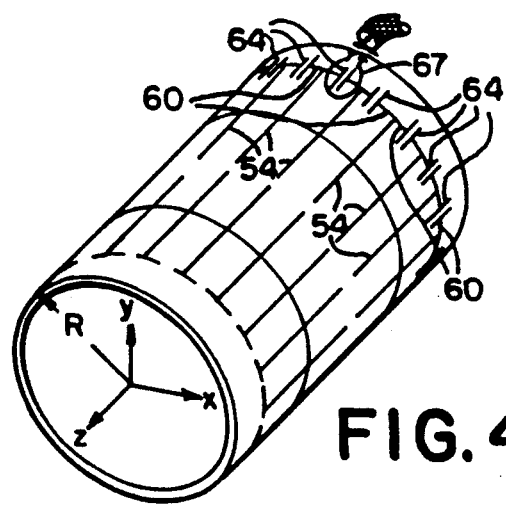
FIG. 4a
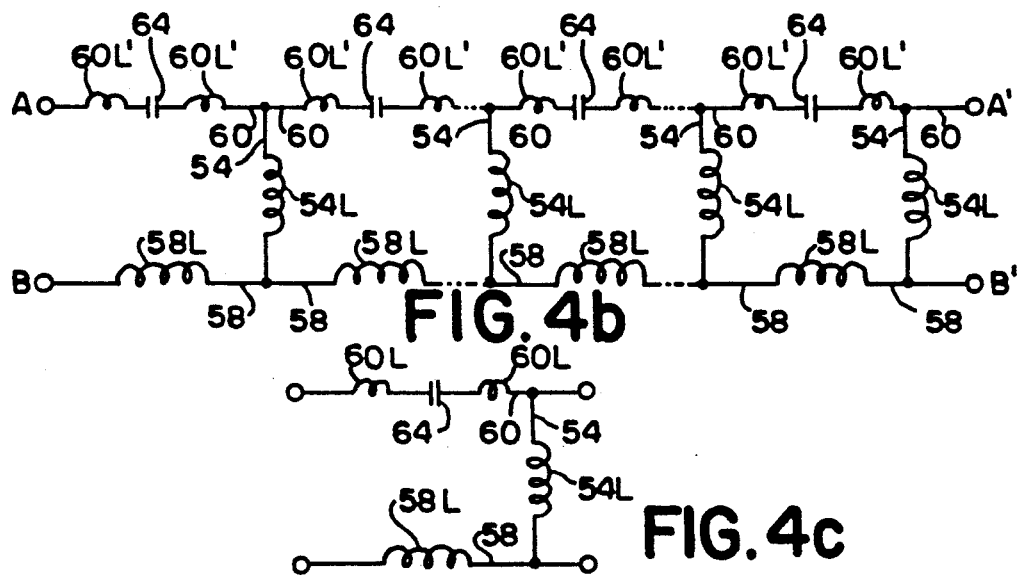
FIG. 4b
FIG. 4c
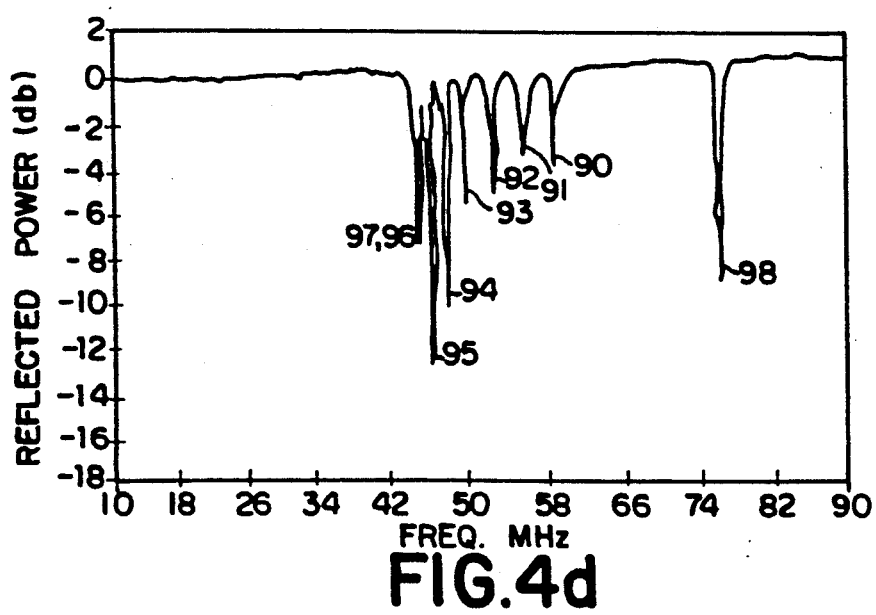
FIG. 4d

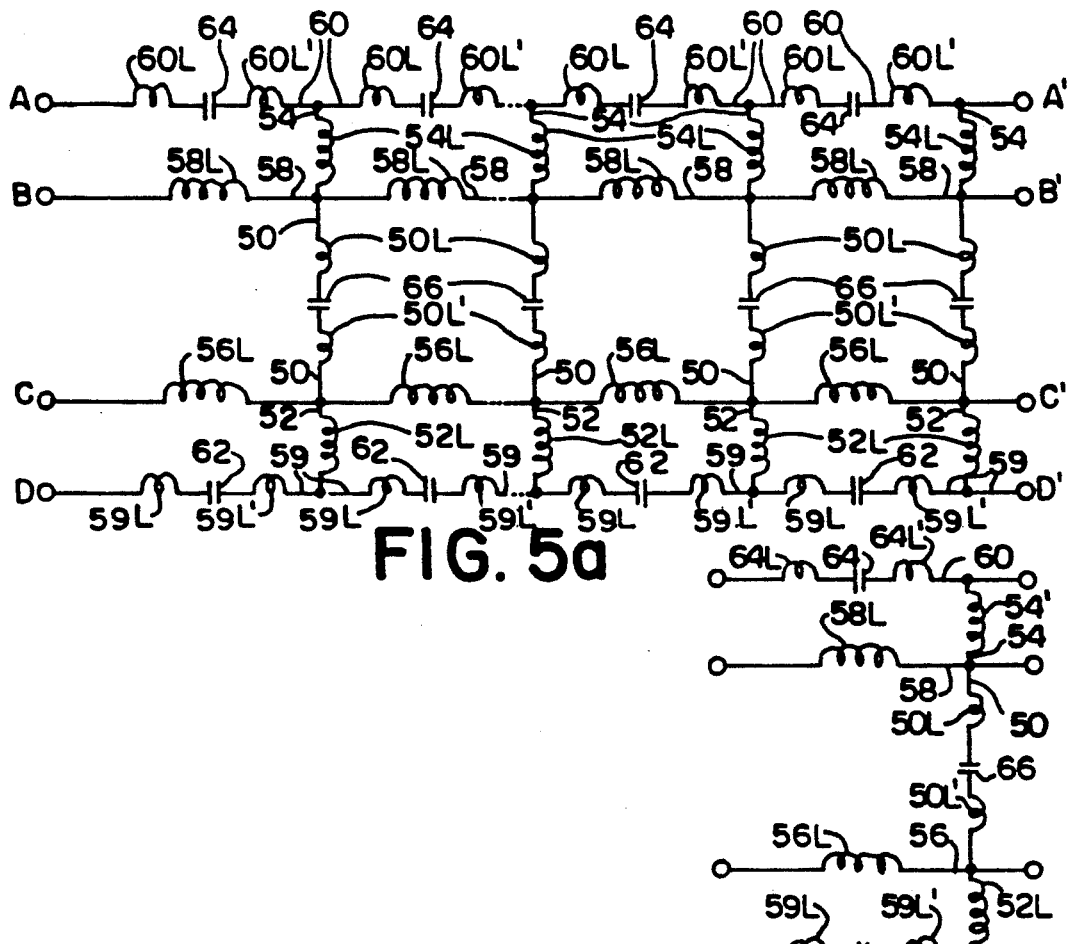
FIG. 5a
FIG. 5b
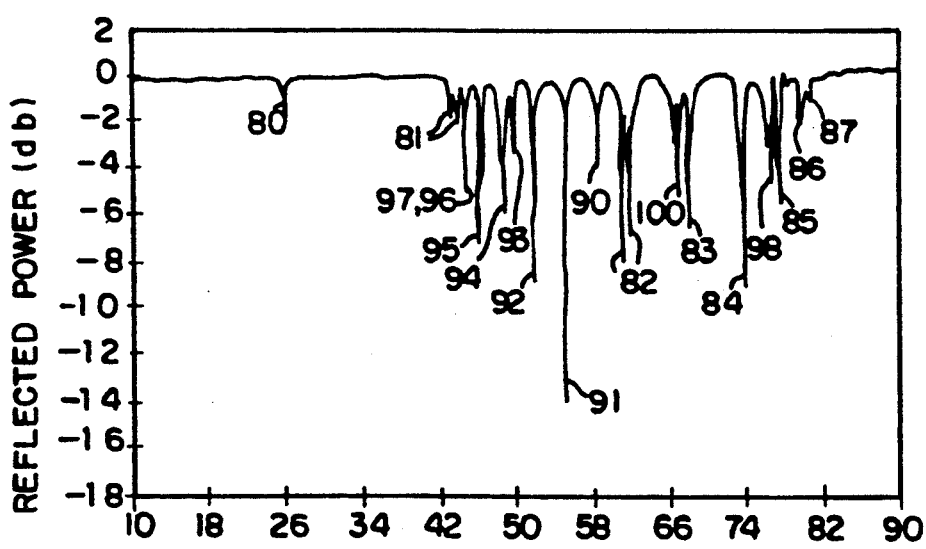
FIG. 5c

RADIO FREQUENCY VOLUME RESONATOR FOR NUCLEAR MAGNETIC RESONANCE

Pursuant to 35 U.S.C. §202(c) it is hereby acknowledged that the U.S. Government has certain rights in the invention described herein, which was made in part with funds from the National Institutes of Health.

The present invention relates to an improvement in nuclear magnetic resonance (NMR) apparatus and, more particularly, to resonators for transmitting and/or receiving radio frequency (RF) signals characteristic of signals emitted by nuclei in NMR analyses. More specifically, the inventive resonator provides multiple high-frequency current paths for multiple tuning of the coil and for generation of radio frequency flux at each NMR frequency. Reduced circuit interactions between NMR frequencies permit rapid tuning and alignment of the linear modes of the resonator. Further, the invention relates to simultaneous operation of the resonator in circularly polarized mode at all NMR frequencies.

BACKGROUND OF THE INVENTION

The NMR technique is based upon the magnetic properties of nuclei containing odd numbers of protons and neutrons. These nuclei possess an angular momentum related to the charge thereof. The magnetic moment is directed along the spin axis of each nucleus. When placed in a strong and generally homogeneous static magnetic field, designated $B_o$, the nuclei either align with or against the applied field and precess with a common sense about the applied field. The precessional angle of a nucleus may be changed by absorption of elecromagnetic energy through a phenomenon known as nuclear magnetic resonance, NMR, which involves impressing upon the nuclei a second rotating magnetic field, designated $B_1$, of frequency to match that of their normal precession. When the applied RF magnetic field is removed, the nuclei precess and relax toward their equilibrium conditions, generating radio frequency signals characteristic of the molecular environments in which the nuclei reside. The frequency at which they precess is known as the Larmor frequency and is given in annular frequency by $\omega = \gamma B$. $\gamma$, the gyromagnetic ratio, is a constant for each nucleus or nuclear isotope and generally results in widely separated Larmor frequencies for a given applied field strength, $B_0$. B is the magnetic field acting on the nuclei and is modified by the molecular environment of a nucleus according to $B = B_0(1-\delta)$. $\delta$ is the chemical shift offset impressed upon chemically equivalent nuclei by the local electronic distribution. Measured usually in parts per million, chemical shifts of a particular nucleus or nuclear isotope produce much smaller differences in frequency, and spectra derived from them can be used to obtain quantitative, structural, and dynamic information about the molecules of a sample. In another configuration, a bias or gradient in the normally homogeneous $B_0$ field is introduced across the sample for the purpose of spatially encoding information into the NMR signals. Images are later reconstructed from the information contained within this data, forming the basis of NMR imaging, a technique now widely used in medical diagnostics. Because the Larmor frequency is proportional to the applied field $B_0$, local resonance frequencies will vary across the sample according to the strength of the magnetic field. It is only with technical difficulty that homogeneous $B_0$ fields are obtained, and high-field magnets are usually provided with electronic shim coils to counter both residual distortions of the magnet and the susceptibility distortions from sample or tissue being investigated and from materials comprising NMR probe. Acquisition of highly resolved spectra from a sample is usually preceded by a "shimming" procedure using a high sensitivity NMR signal from hydrogen protons or another abundant nucleus. In very high-field spectroscopy, the stability of the magnetic field is further maintained by electronically comparing the frequency of an NMR signal derived from a separate nucleus, typically deuterium, with that of a stable RF oscillator and engaging a field sweep coil in the feedback loop of the field stabilization circuit.

The $B_1$ field for transmitting to the sample is derived most efficiently from a resonant radio frequency (RF) coil placed in proximity to the sample and connected to the RF transmitting apparatus. Either the same or a second RF coil may be connected to the RF receiving apparatus to receive the NMR signals, which are induced in the coil by the precessing magnetism of the nuclei. Free induction signals from chemically shifted nuclei and from samples with field gradients impressed upon them are normally received with a single-resonant coil tuned to the Larmor frequency of the nucleus. Transmitting to and receiving NMR signals from two different nuclei or nuclear isotopes, however, generally require use of two coils each single tuned or a single coil doubly tuned to the individual Larmor frequencies. The lossy circuit elements in double-tuned, single coil probes necessarily make them less sensitive than their single-tuned counterparts. Considerable care must be exercised to maintain maximal sensitivity at each frequency, and maximal sensitivity at one frequency is frequently achieved at the cost of less sensitivity at the other. Improved sensitivity and a reduction in transmitter power can be obtained if a coil can be operated in circularly polarized mode. See C.-N Chen, D. I. Hoult, and V. J. Sank, J. Magn. Reson. 54, 324-327 (1983). A linear oscillating field, such as produced by a simple resonant coil, can be cast as the sum of two circularly polarized components of equal amplitude. Likewise, by combining the linearly oscillating fields of two well-isolated single-tuned coils or the well-isolated fundamental modes of a multi-modal structure such as the "birdcage" coil (see Hayes et al., J. Magn. Reson., 63, 622–628 (1985)), a single, circularly polarized magnetic field can be produced which matches the precessional motion of the nuclei. Circularly polarized coils are similar to crossed-coil double-tuned probes in that two resonant circuits require tuning. They differ, however, in that being of the same frequency, they require a high degree of electrical isolation to operate independently, as will be discussed later.

Many clinical applications of NMR spectroscopy find their origins in conventional high-field chemical NMR spectroscopy. Dual and triple tuned probes are employed wherein one channel, tuned typically to deuterium, is used for shimming and field stabilization of the magnet. The NMR signal is derived from a small amount of typically deuterated solvent added to the sample. In another application involving acquisition of spectra from "X-nuclei," that is, nuclei other than protons having lower frequencies, lower abundances, and consequently lower sensitivity, the sensitivity of these nuclei can be enhanced via the Nuclear Overhauser Effect (NOE) and decoupling of proton spins by irradiating the sample with a modulated signal at the proton frequency. The NOE increases the polarization of X-nuclei by transferring it from the proton spin population, which by virtue of its higher frequency exhibits greater polarization. Finally, heteronuclear experiments are employed wherein RF pulses are applied simultaneously or at alternating intervals to the populations of two nuclei to derive chemical bond and other information related to spins that are proximate to one another. One class of these experiments termed "indirect" experiments, relies upon the greater sensitivity of the protons signal to yield structural and dynamic information about much lower abundant and less sensitive nuclei.

In performing medical NMR spectroscopy, the NMR instrument is generally configured to observe a single nucleus such as hydrogen protons (1H), phosphorus-31 (31P), or carbon-13 (13C). Since phosphorus containing metabolites are key indicators of the state of tissue, considerable effort has been directed towards acquiring and analyzing phosphorus spectra from tissue. Acquisition of high sensitivity phosphorus and other spectra from human tissue is presently being investigated as a technique for identifying and characterizing tissues and following their response to treatment. For the human brain, in particular, a "birdcage" coil of reduced axial length for improved sensitivity has been developed (see U.S. Pat. No. 4,885,539). The coil, owing to its reduced length, provides an improvement in circuit Q by reducing RF eddy current losses in normally highly conductive tissue. The patient examination is complicated, however, first by the need to shim the static magnetic field, $B_0$, using the hydrogen proton resonance from tissue and, second, the need to acquire proton images of the patient for later correlation of spectral data with the patient anatomy. Typically, a separate coil tuned to the proton frequency is employed for shimming and imaging, and is subsequently replaced with the phosphorus coil for acquisition of in vivo spectra. It is apparent that removal of the patient from the magnet during the exam is unnecessary with a coil which is dual tuned for both frequencies patient examination time is thereby reduced. An additional benefit of a dual tuned resonator is the ability to perform proton decoupling by transmitting a suitable decoupling waveform at the second, proton frequency. Proton decoupling improves the resolution and sensitivity of X-nuclei by averaging and effectively removing the coupling between the different nuclear spins. Decoupling efficiency increases with increased transmitted power. At a $B_0$ field of 1.5 Tesla, however, the power deposition from head coils operating in linear mode approaches acceptable limits set forth in FDA guidelines. Power deposition will increase with $B_0$ field, owing to the greater losses in tissue at higher frequency. It is therefore apparent that operation of the proton channel of a dual tuned resonator in circularly polarized mode can reduce power deposition and/or improve decoupling efficiency.

Implementation of a dual tuned resonator operating simultaneously in circularly polarized (CP) mode at both frequencies has not been possible using existing methods. In attempting to implement dual tuned CP volume resonators, reactive elements have been incorporated into the conductors of normally single-tuned birdcage coils to make them doubly resonant. See A. R. Rath, J. Magn. Reson., 86, 488–495 (1990). With capacitors chosen to be less lossy than the inductors of the coil, the low frequency mode suffers a greater loss in efficiency when compared with the performance of its single-tuned counterpart. It is a further feature of this method of double tuning that additional inductors do not contribute substantially to the generation of the RF magnetic field, $B_1$, in the sample at either frequency. Because of the strong interaction between tuning elements, these resonators exhibit complex tuning, matching and mode alignment problems at both NMR frequencies. The process of tuning, matching and mode alignment at both frequencies is an iterative one with iteration not necessarily leading toward the optimal outcome. Thus, true simultaneous operation of these dual tuned resonators circularly polarized mode has not yet been possible.

SUMMARY OF THE INVENTION

The present invention has a primary purpose to provide a volume resonator capable of operating simultaneously or sequentially in spatial quadrature, or circularly polarized mode, at two selected NMR frequencies.

Various modes of operation ar contemplated in which the resonator is operated simultaneously at two or more NMR frequencies, i.e., for two or more separate but naturally occurring nuclei. With the present invention, it is possible to obtain proton (1H) images of the patient during a spectroscopic examination. It is also possible with straightforward modifications to the instrument hardware to acquire spectroscopy data at two frequencies, e.g., from both $^1$H and $^{31}$P nuclei during the spectroscopy portion of the exam without requiring the patient to be moved. Another way of operating dual frequency resonator is to use the $^1$H channel of the coil for what is called "proton decoupling". When a prescribed decoupling waveform is delivered to the resonator at the proton frequency, many of the phosphorus signals emanating from phosphorus-proton containing metabolites in tissue exhibit improved sensitivity both in the strength and sharpness of the signals.

The advantages of the resonator of the present invention may be summarized as follows:

(1) Operation of the resonator at two frequencies for both sequential and simultaneous acquisition of NMR data from two nuclei.

(2) A more efficient operation of the resonator in that the plurality of conductors employed to construct the coil also provide substantially a homogeneous radio frequency magnetic field along the cylindrical axis of the resonator to excite and detect the second nucleus ($^1$H).

(3) Reduced circuit interactions between the two NMR frequencies, allowing the fundamental or K=1 modes at each frequency to be individually tuned and matched.

(4) Reduced circuit interactions between the two NMR frequencies, allowing the fundamental or K=1 modes at each frequency to be individually spatially aligned.

(5) Improved sensitivity or signal-to-noise ratio of received signals from either nucleus in that both channels are operated in circularly polarized (spatial quadrature) mode.

(6) Reduced transmitter power requirements when operating the resonator in circularly polarized mode at either frequency.

(7) Homogeneous radio frequency or $B_1$ field about the axis of the resonator afforded by the cosine distribution of currents around the periphery of the coil in circularly polarized mode.

Thus, these resonators are to be useful in both the clinical and high-field research environments. The dual radio frequency resonator is presently used in clinical spectroscopy studies of the head and extremities. In the high-field research environment, it is expected to have early application to large volume samples, especially in vivo studies of perfused blood cells and tissues. In reduced scale designs there will be early use with 5 mm and 10 mm sample tubes. Later is expected application in very high field, high-resolution spectroscopy probes, such as the currently available 600 MHz instrument.

More specifically the present invention relates to a dual radio frequency volume resonator of generally cylindrical form for use in NMR. The coil of the resonator has four high frequency ring current paths. The coil also has three sets of generally parallel paths, each set being equally spaced from one another. Adjacent paths and adjacent rings thereby form current loops. At least one discrete capacitor is interposed in and interrupts each loop, whereby in combination with the inductance in each loop, including inherent inductance in conductors, resonant frequency loops are formed.

DRAWINGS

For a better understanding of the present invention reference is made to the following drawings:

FIG. 2a is a perspective view of a preferred physical embodiment of an NMR Dual RF resonator in accordance with the present invention;

FIG. 3b is a portion of the developed schematic equivalent circuit of the cylindrical resonator meshes of FIG. 3a;

FIG. 3d is a plot of reflected power vs. frequency response of the circuit of FIGS. 3a-3c with the coupling inductive loop placed over the low pass portion of the resonator shown in FIG. 3a;

Figure 2B:
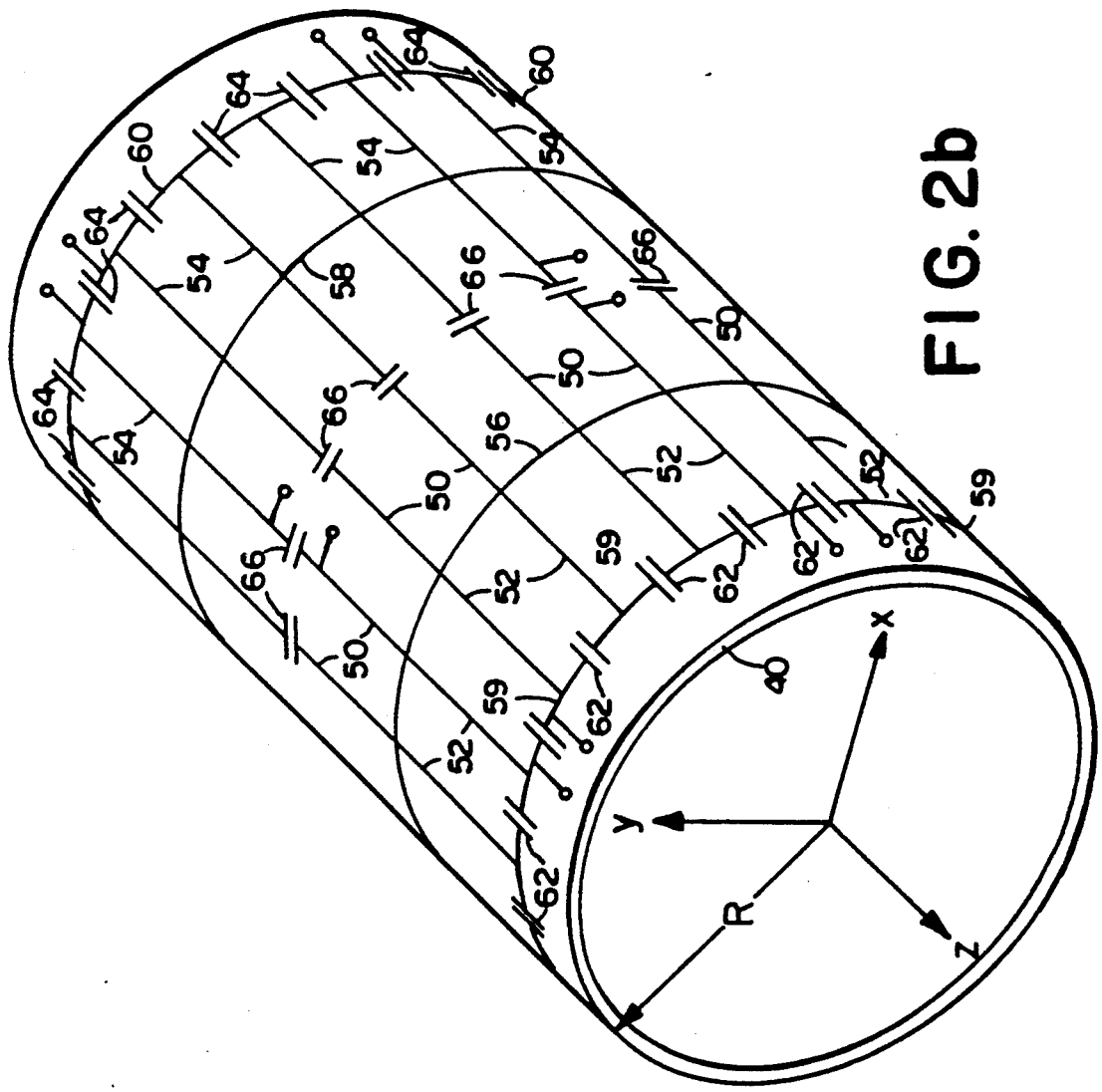
FIG. 2b is a similar view of the resonator of FIG. 2a as a schematic circuit, but showing the location of capacitors and input/output coupling points.
Figure 5D:
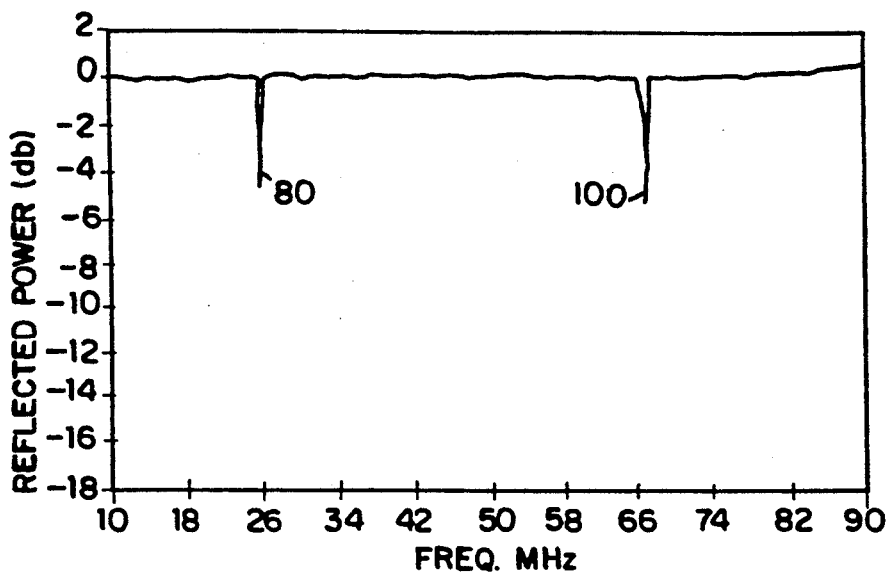
Figure 6:
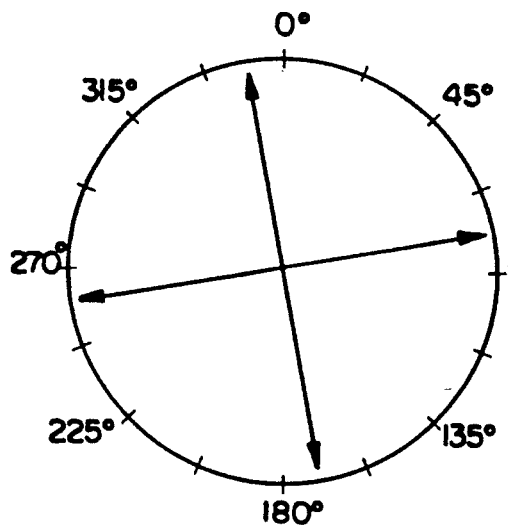
Figure 6:
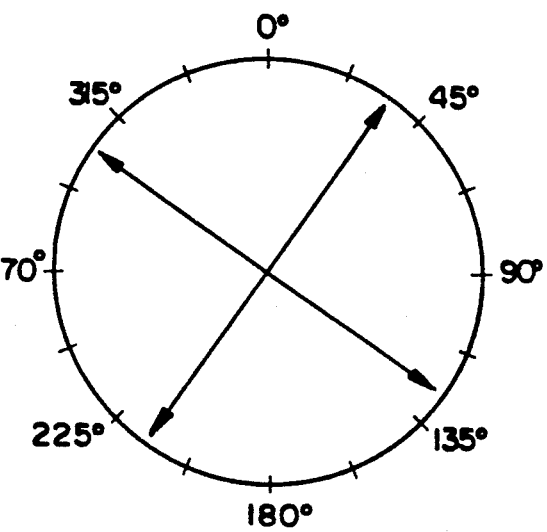
Figure 7:
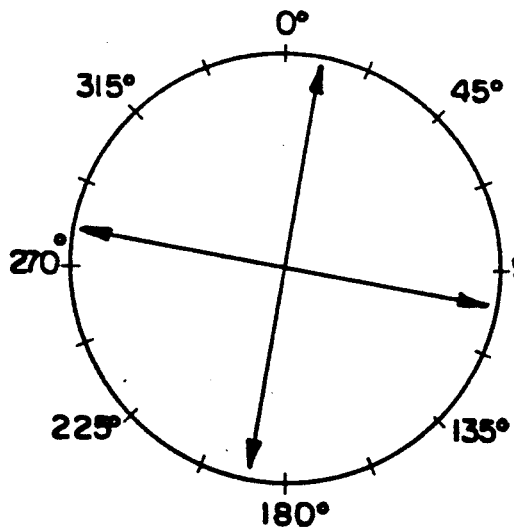
Figure 7:
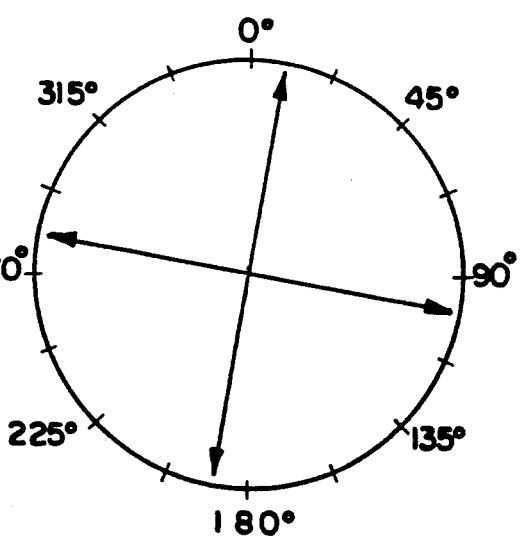
Figure 8A:
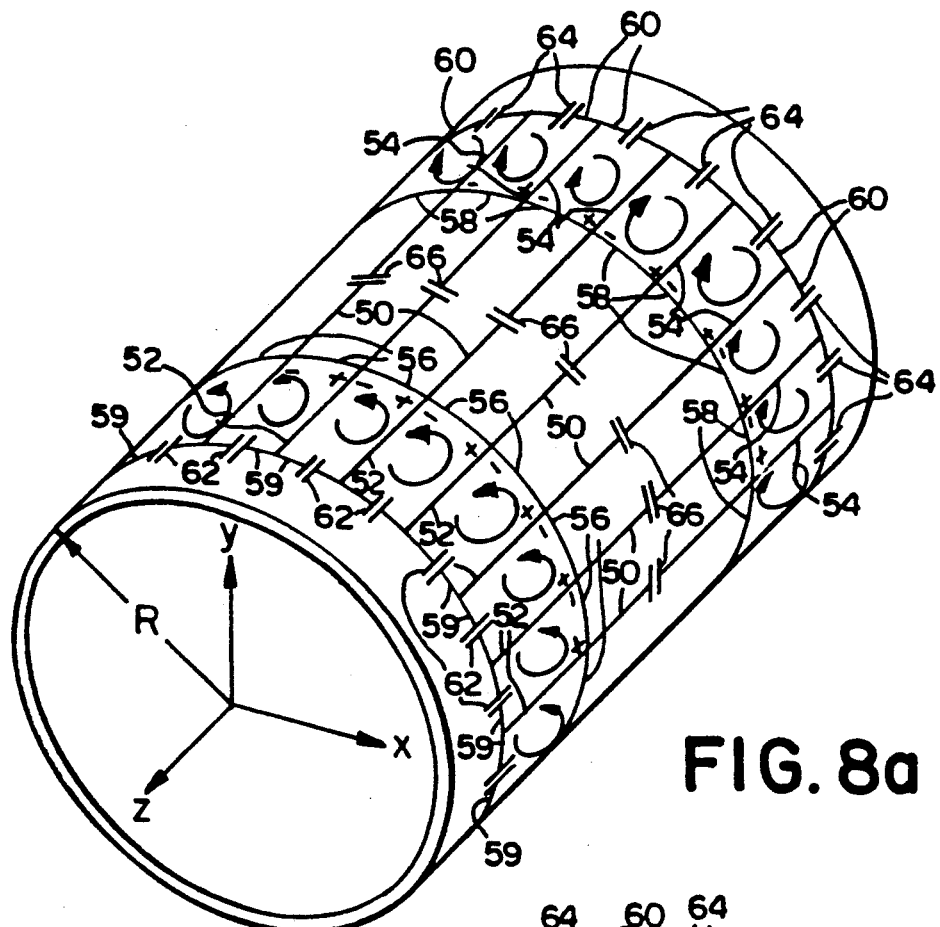

FIGS. 4a-4c correspond to FIGS. 3a-3d but are schematic circuits for one of the outer single-sided high pass volume resonator capable of operating independently;

FIG. 4d is a plot of reflected power vs. frequency in the circuit of FIGS. 4a-4c with the coupling inductive loop placed over one of the single-sided high-pass portion of the resonator of FIG. 4a;

FIG. 5a is a portion of the developed schematic for the total Dual RF volume resonator shown schematically in FIG. 2b, including all capacitors in the structure;

FIG. 5b is an individual repetitive circuit unit of the circuit of FIG. 5a;

FIG. 5c is a plot of reflected power vs. frequency response of the circuit of FIGS. 5a and 5b using an inductive coupling loop placed over both the inner and one outer structure;

FIG. 5d is a plot of frequency similar to the same circuit using an inductive coupling loop placed in the physical center of the volume resonator;

FIG. 6a, shows an example of the orientation of the two linear K=1 modes of one of the two single-sided high pass resonators capable of operating near 58 MHz;

FIG. 6b shows an example of the natural orientation of the two linear K=1 modes of the second single-sided high pass resonator capable of operating near 58 MHz;

FIG. 7a shows the orientation of the fundamental counter-rotating modes of the two single-sided high pass volume resonators resulting from the outer structure of FIGS. 6a and 6b strongly coupled through the inner low-pass structure and operating near 58 MHz;

FIG. 7b shows the orientation of the fundamental co-rotating modes of the two single-sided high pass volume resonators resulting from the outer structures of FIGS. 6a and 6b strongly coupled through the inner low pass structure, and operating near 67 MHz;

FIG. 8a illustrates the sinusoidal counter rotating current distributions in the outer structures and the electric potentials of similar polarity developed therein across the inner low pass structure due to the currents in the two single sided high pass resonators.

Figure 8B:
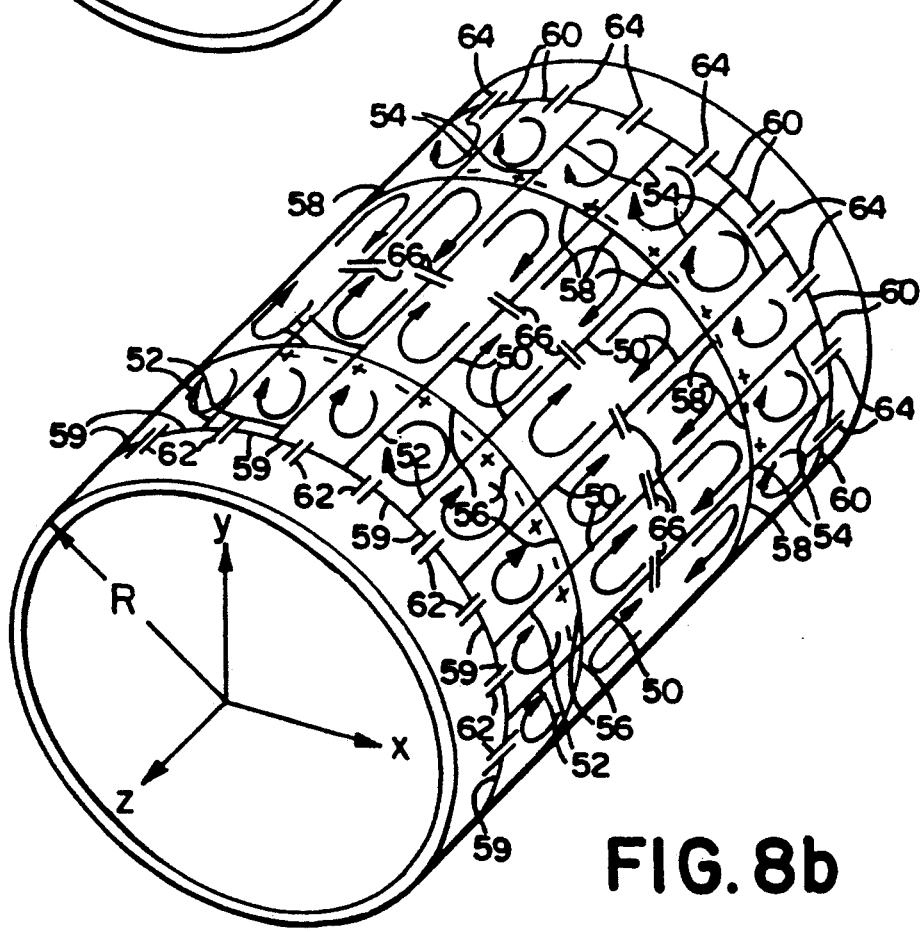

FIG. 8b illustrates the sinusoidal co-rotating current distributions in the outer structures and the electric potentials of opposite polarity developed therein across the inner low pass structure thereby allowing current to flow across the conductive segments of the inner Low Pass structure.

Figure 9A:
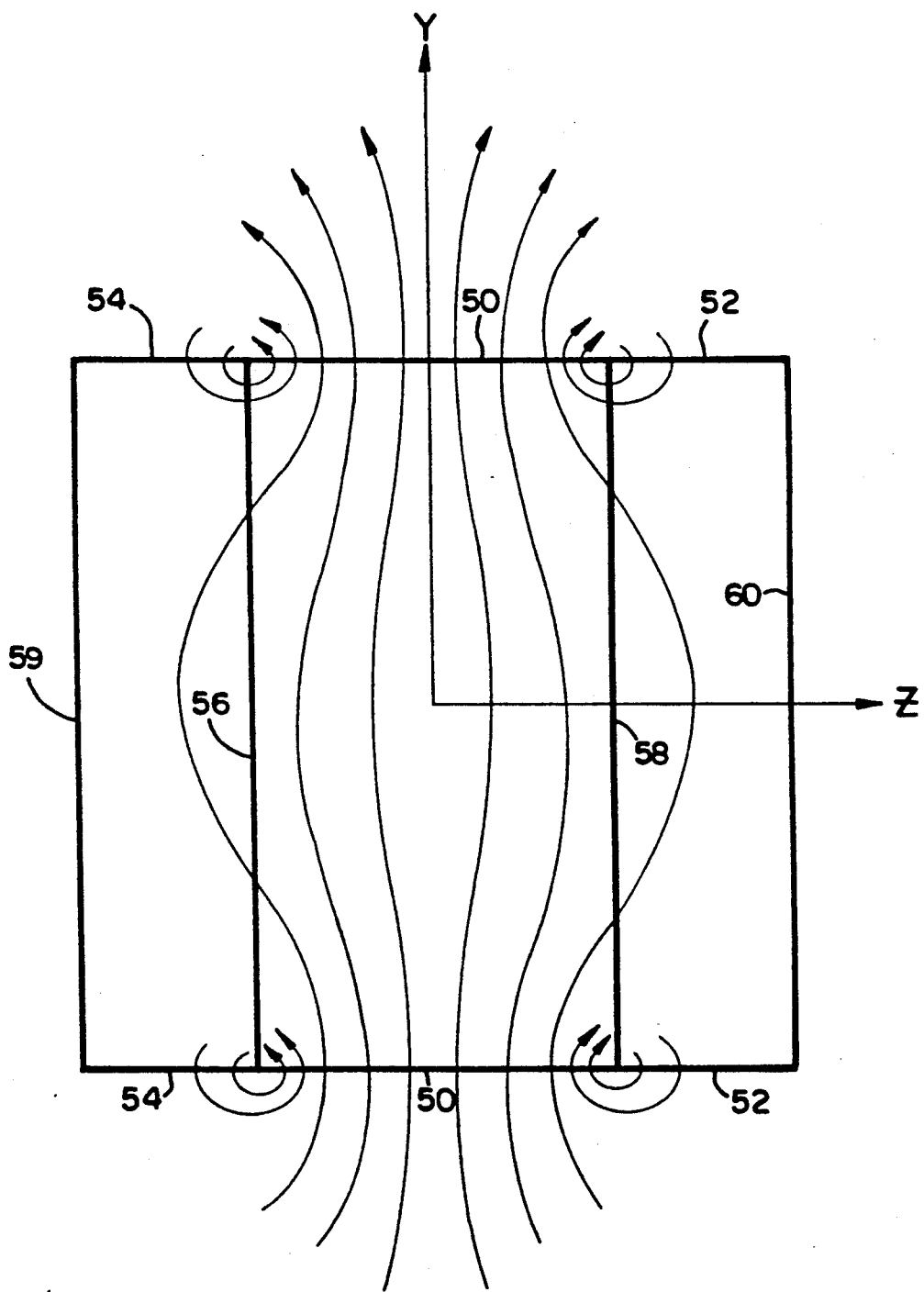

FIG. 9a is a plot of the radio frequency flux lines of the inner, low frequency resonant structure in a plane through the longitudinal axis of the coil.

Figure 9B:
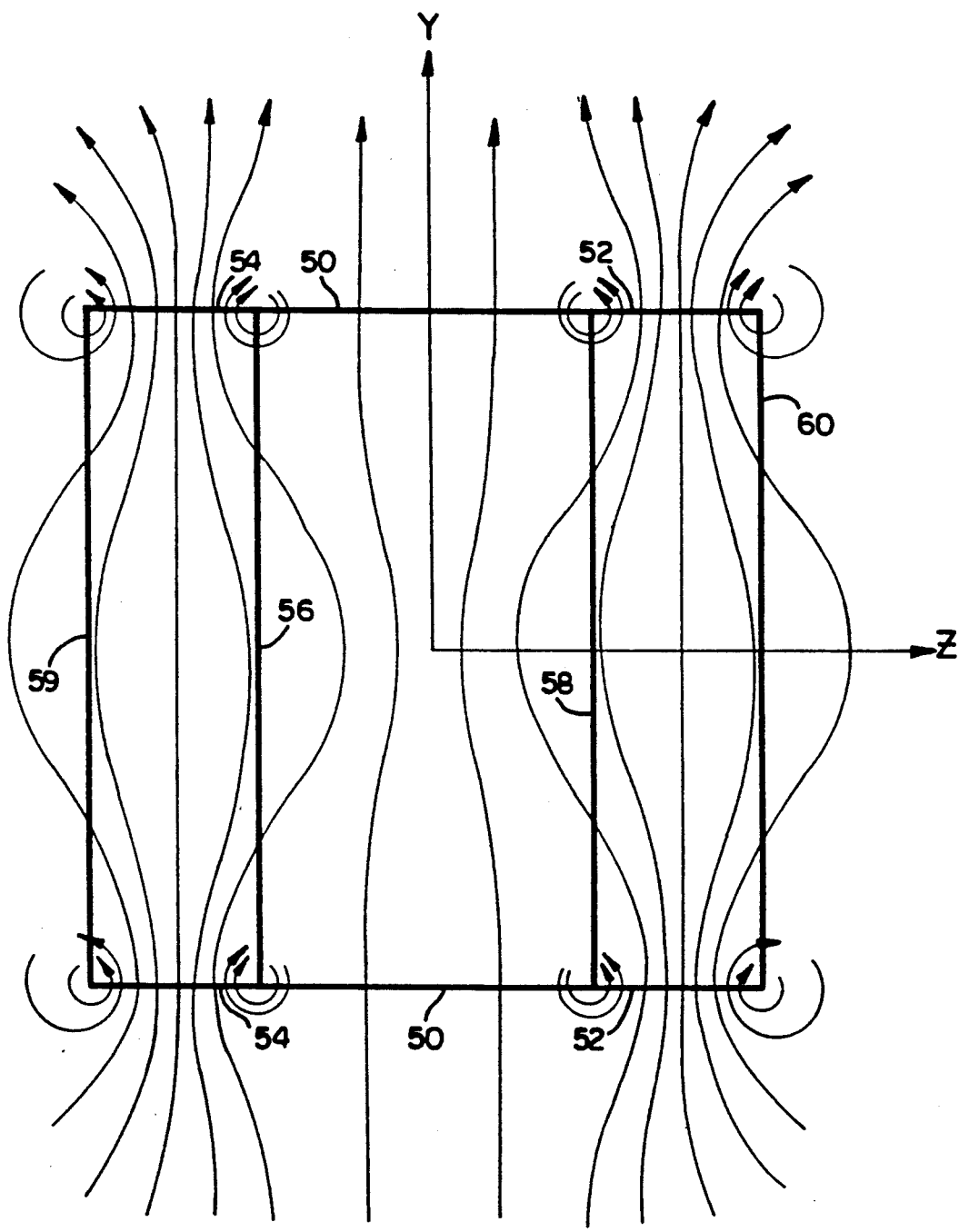

FIG. 9b is a plot of the radio frequency flux lines of the outer, high frequency resonant structures in a plane through the longitudinal axis of the coil.

Figure 11:
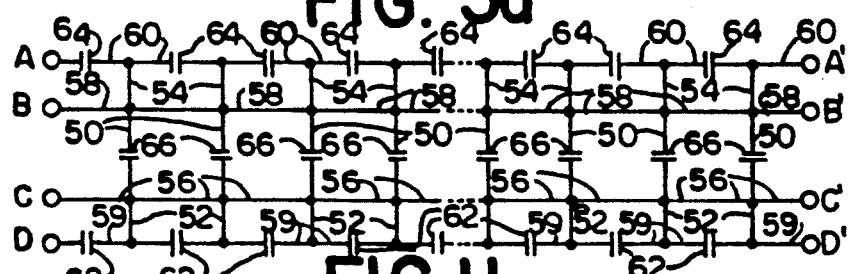
Figure 12:
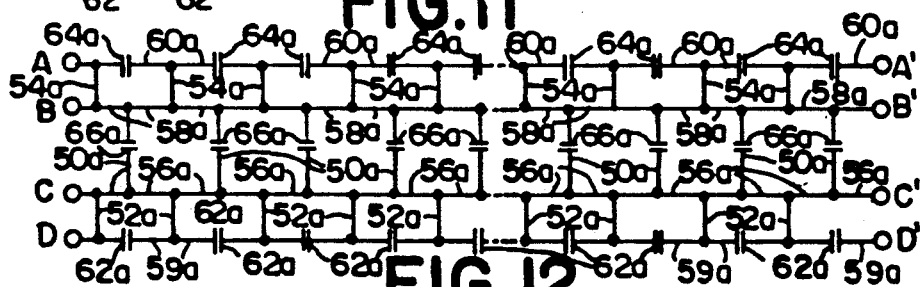
Figure 13:
Figure 14:
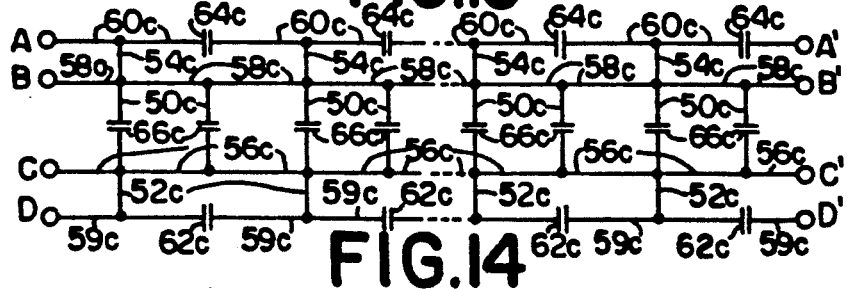
Figure 10:
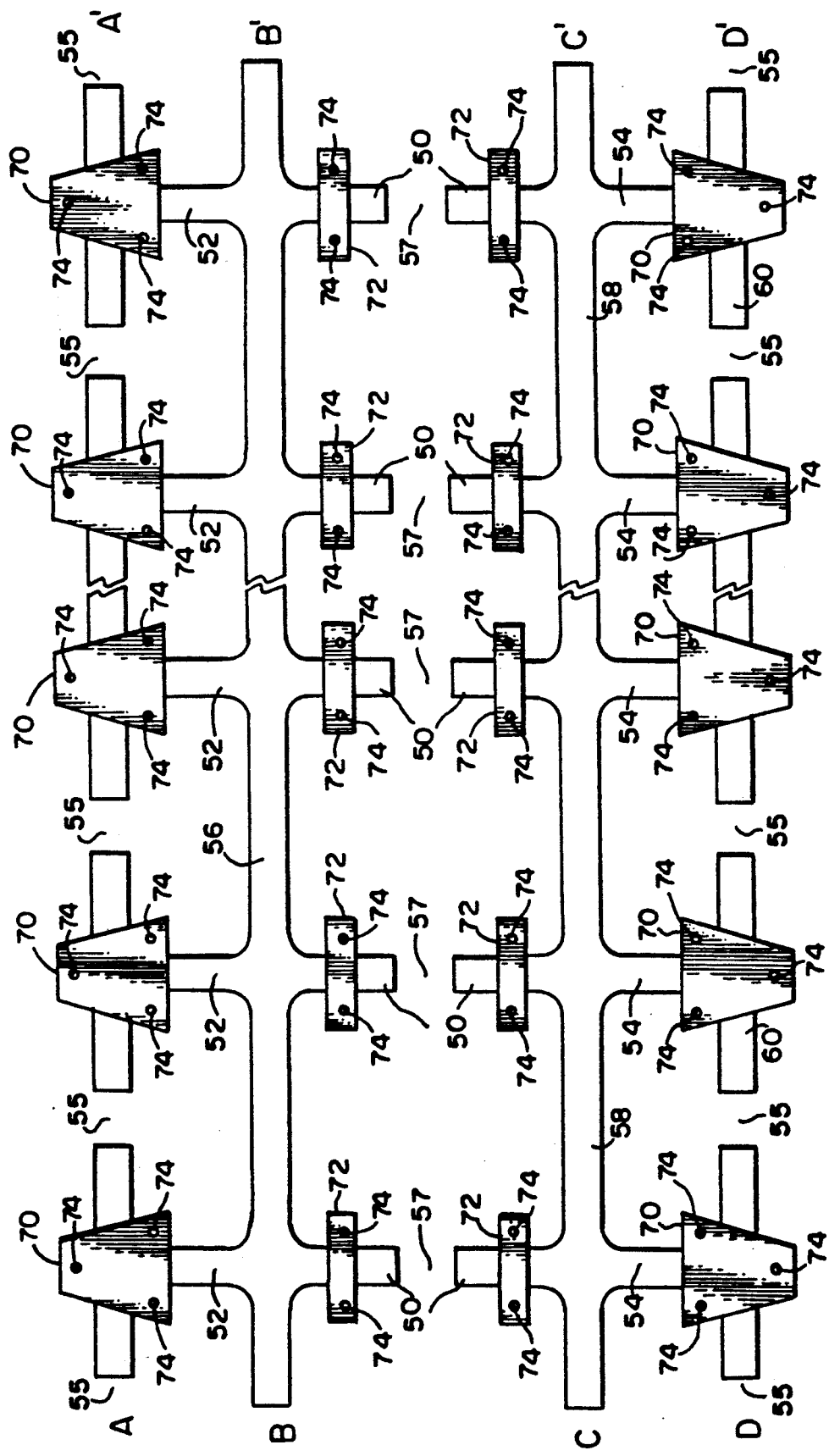

FIG. 10 depicts the preferred physical form of the present invention in a planar developed representation showing mounting supports utilized in the preferred embodiment;

FIG. 11 is a schematic partial development of the preferred embodiment circuit from FIGS. 2b and 10 to provide direct comparison with the following figures; and FIGS. 12, 13 and 14 are schematic partial developments similar to FIG. 11 showing alternative circuit configuration embodiments of the present invention.

PRIOR ART

The applied field $B_o$ by convention is considered to be directed in and defining the z-direction for NMR. RF coils that are a part of a simple resonant circuit, have a single distribution of current oscillating in phase and produce a linearly polarized radio frequency magnetic field, $B_1$, over the sample. The linearly oscillating component $B_1$ transverse to the applied field $B_o$ (generally considered to be directed in the z-direction), $B_{1xy}$, mutates the nucleus in a predetermined manner during transmission. Likewise, by the principle of reciprocity, the coil receives signals from nuclei of the sample with a profile weighted by the magnitude of $B_{1xy}$.

It is desirable and often necessary for many NMR experiments or pulse sequences to operate an NMR probe (either sequentially or simultaneously in time) at two frequencies. It was recognized very early that there are two ways of achieving this. The first was to take advantage of the isolation that one can obtain by using two crossed or spatially orthogonal NMR coils. The second method is to use a single NMR coil and add inductor-capacitor pairs to make it doubly resonant. Another class of multiply tuned resonant circuits, called over-coupled tank circuits, are constructed by strongly coupling circuits which are individually resonant (see M. D. Schnall et al., J. Magn. Reson. 67, 129-134 (1986)). Coupling of the circuits is reactive and can be either capacitive, inductive, or both. When two resonant circuits of approximately the same resonant frequency are coupled strongly to one another, two modes develop in the individual resonant circuits at different frequencies in which the currents are either in-phase or out-of-phase with one another. In both classes of double resonant circuits, currents are circulating in the resonant pairs at both frequencies. Thus, when tuning and matching of one of the resonant pairs to affect one mode, the second mode is invariably affected.

It is well known that further improvement in NMR probe transmission efficiency can be obtained by the use of coil structures which create a circularly polarized $B_1$ field transverse to the applied field $B_o$ (see Chen et al.). Within a linear polarized coil, transmitter power is divided equally between right-hand and left-hand circular polarizations. Since only one of these polarizations matches the precessional motion of the nuclei, a factor of two reduction in the power can be achieved by direct generation of the single polarization. By reciprocity, the signal detected from the sample will likewise double. Noise from the two linear channels used to detect the polarization, on the other hand, is uncorrelated and therefore increases by a factor of root two for equal gain channels (noise amplitudes add in quadrature). A net increase of root two in sensitivity can thus be obtained by use of a circularly polarized coil.

A simple embodiment of a circularly polarized coil is two circular loop coils positioned 90 degrees with respect to one another. If transmitter power is applied to the ports of each single-tuned coil 90 degrees out of phase, a single circular polarization will be generated at the center of the two coils. In the same manner, when free-induction signals from each port of the coils are combined in quadrature, or 90 degrees apart, only a single polarization is detected from the sample. Another embodiment of a circularly polarized coil is the "birdcage" resonator, so called because of its appearance (see C. E. Hayes et al. (1985) and U.S. Pat. No(s). 4,692,705 and 4,694,255). A distributed inductance capacitance structure of this type characteristically has a number of electrical modes. The fundamental electrical (k=1) modes provide two orthogonal spatial modes in the interior of the coil (see J. Tropp (1989)). These modes, by virtue of their sinusoidal distribution of current around the coil periphery, provide a more homogeneous $B_1$ field across the sample (see also Hinshaw U.S. Pat. No. 4,439,733).

It is very important that matching circuitry couple only to their respective electrical modes; coupling of a given port to both electrical modes will quickly degrade either transmitter or receiver efficiency, depending upon the relative polarity of the coupling. The electrical isolation measured between the coupling ports is a measure of the degree to which each port couples only to its designated linear (k=1) mode. Variable capacitors mounted about the periphery of the coil are used to rotate and align the spatial modes. The resonator may be driven in circularly polarized mode in both frequencies either capacitively across the input/output coupling points as shown in FIG. 2b or inductively with coupling loops like the ones shown in FIG. 3a and FIG. 4a, spaced 90 degrees apart. When the modes are properly aligned, the ports couple only to their respective linear modes, and high degree of electrical isolation between the ports is achieved. Under the condition of weak coupling between matched ports, the ratio of the output voltage to the input voltage at the other port is $\kappa Q/2$, where $\kappa$ is magnetic coupling coefficient and Q is the circuit Q. For high Q coils, a high degree of mode isolation is thus required to reduce the voltage ratio to a value much less than one. In practice, we have found that this value should be 0.03 (−30 dB) or greater for superior transmitter/receiver performance.

Figure 1A:
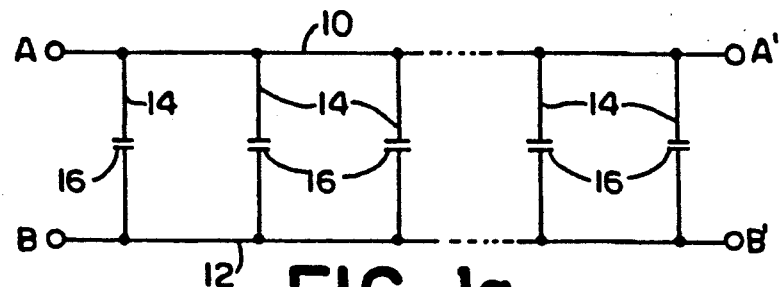
FIG. 1a is a developed partial schematic for a prior art single-tune low pass volume resonator.
Figure 1B:
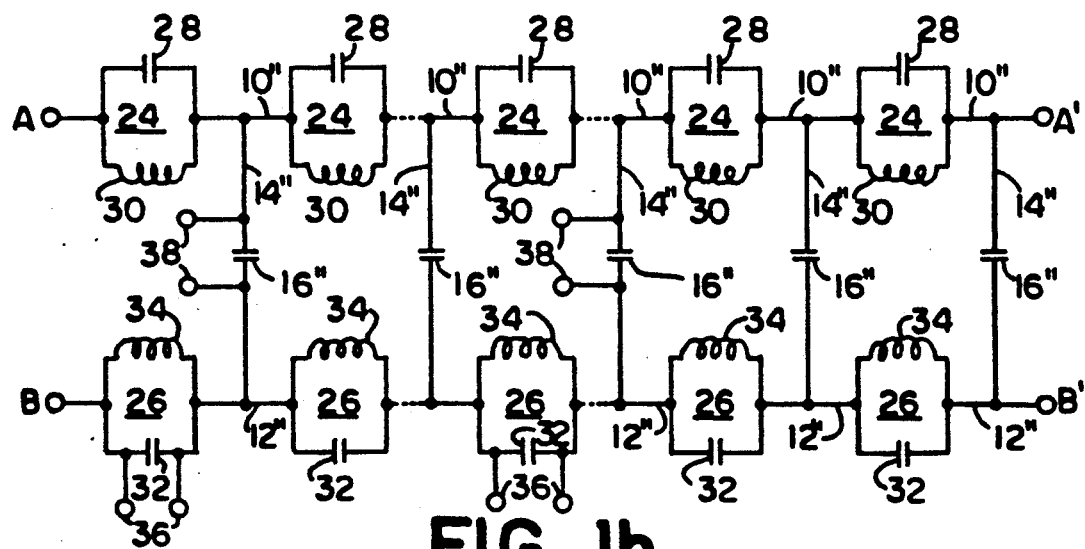
FIG. 1b is a developed partial schematic for a prior art double-tune band stop volume resonator.

When contemplating double-timing of circularly polarized coils, there is a manifold increase in the possible interactions among elements for tuning, matching, and mode alignment of the probe. As an example, we use the low-pass birdcage resonator of FIG. 1a. It effectively involves a pair of closed ring conductors 10 and 12 having uniformly spaced identical connecting conductors 14, each of which contains a bypass capacitor 16. Double-tuning of this circuit with the standard method of inserting inductor-capacitor pairs in ring conductors 10 and 12 results in the "band-stop" birdcage resonator of FIG. 1b. In FIG. 1b each of the connecting paths 14″ contains a capacitor 16″. In each closed ring conductor 10″ and 12″ there is connected a resonant circuit, resonant circuit 24 in ring 10″ and resonant circuit 26 in ring 12″. Each of the resonant loops 24 contains a capacitor 28 and inductance 30 in parallel. Similarly loops 26 contain in parallel a capacitor 32 and inductance 34. Capacitive or inductive coupling may be used for input and output at both the NMR frequencies. With twice as many linear modes occurring at each NMR frequency, it is apparent that the doubly-tuned version will exhibit additional between frequency interactions when compared with a double-tuned linear coil. The number of interactions will be further increased by the need to align the linear modes at each frequency. It is apparent that complex tuning-matching interactions exist even in a well aligned resonator. Owing to the high degree of isolation between each mode pair, the most sensitive of all adjustments involves mode alignment at both frequencies. Interactions involving tuning at one frequency, mode alignment and thence matching at the other frequency are circular in iteration, with iteration not necessarily progressing towards optimal tuning, mode alignment, and matching. In an initial study of a "band-stop" double-tuned birdcage, true simultaneous operation of the resonator in quadrature at both frequencies was not achieved (see A. R. Rath, J. Magn. Reson. 86:488-495 (1990)). It is therefore imperative that the design of the resonator allow for a reduction or elimination of these interactions if complete tuning, matching, and alignment of the coil is to be performed quickly. This becomes even more important for clinical and in vivo applications where variations in sample size and shape have the greatest effects upon matching and mode alignment.

The $B_1$ field of a birdcage resonator double-tuned with inductor-capacitor pairs is derived primarily by the conductor of the birdcage coil. The gross $B_1$ field distributions at each frequency will be the same. For the short birdcage coil pattern which has a length chosen optimally for spectroscopy of the head, the field variation at the proton frequency is too large for the purposes of imaging and proton decoupling. With one frequency tuned for protons for proton decoupling, the decoupling efficiency will be degraded in regions of the sample where proton $B_1$ field has deviated appreciably from its nominal value, for example, by falling to half its value at the coil center. Inadequate decoupling can occur in important regions of the sample resulting in artifacts in the spectrum of the X-nucleus under observation.

SPECIFIC DESCRIPTION OF THE INVENTION

The present invention involves a dual RF resonator which can be operated simultaneously and in circularly polarized mode at each of two frequencies. The low pass birdcage coil shown in FIG. 1a is tuned to the phosphorus frequency at 1.5 Tesla (25.67 MHz) and has been used to acquire high quality spectroscopic data from the human head. For this work, the second frequency of the dual resonator is designed to operate at the hydrogen proton frequency of 63.43 MHz. For clinical spectroscopy studies involving phosphorus and other low frequency nuclei, it is especially important that the loss in sensitivity in converting from a single-tuned to a dual tuned birdcage resonator be no greater than a few percent. Otherwise, the benefits from decoupling of proton nuclei with the second frequency of the dual tuned resonator will be compromised. Similarly, loss in sensitivity and transmitting efficiencies and $B_1$ field homogeneity at the proton frequency will compromise decoupling efficiency and proton image quality. The specific technical aims of the dual tuned resonator are primarily (1) to provide simultaneous transmit/-receive capability at two frequencies, (2) to operate in circularly polarized mode at both frequencies, (3) to reduce circuit interactions between frequencies, to allow the spatial quadrature or linear modes to spatially align with their respective coupling sites, (4) to reduce circuit interactions between frequencies, to allow the electrical modes at each frequency to be individually tuned and matched, and (5) to obtain homogeneous $B_1$ fields in the region of the sample at both frequencies.

The preferred embodiment of the dual RF resonator, shown in FIG. 2a and shown schematically in FIG. 2b, may be referred to as a "four ring" birdcage resonator. The four conductive rings 59, 56, 58, 60, which are coaxial, of the same diameter, and spaced along the coil axis to define the cylinder of the "birdcage", are needed to achieve the aims enumerated above. This embodiment is preferred on two counts: first because it is electrically different from the prior art and second because of the specific form that it assumes. Relative to the form, it can be seen in FIG. 2a that a coil is supported on a thin walled tube 40 of a preferably transparent insulating material. It is also preferably capable of being made of sufficiently large size to permit a patient's head to be placed within the tube. The outer cylindrical surface of the tube is covered with a foil or sheet 42 which has through it a plurality of rectangular or oblong openings 44, 46, 48. In this case the openings are aligned along elements of the cylinder and the central opening 44 while of the same width circumferentially is of different length axially from openings 46 at one end and opening 48 at the other. The openings 44, 46 and 48, respectively, are arranged around the circumference equally spaced from one another. The openings are not only equally spaced from one another and uniform in size, but the conductive segments 50, 52 and 54, respectively, between them are uniform. Between openings 44 and 46 is circumferential continuous ring 56 and between openings 44 and 48 continuous ring 58. At the outside edges are rings 59 and 60, respectively, each ring segment of which, however, is interrupted by capacitors 62 and 64, respectively. Strip segments 50 between continuous rings 56 and 58 are also interrupted by gaps which are similarly bridged by capacitors 66.

While the preferred embodiment of the RF resonator has been described in terms of a flat sheet formed about a tubular support, it will be understood by those skilled in the art that the conductors may be made up of individual conductive elements which are wires, conducting tubes, flat conducting tapes or any combination thereof.

In the preferred embodiment of FIG. 2b, a low-pass resonant structure for the phosphorus (P-31) frequency is contained within the core of the coil defined by the two displaced inner rings 56, 58, the conductive segment connections 50 between them and capacitors 66. The conductive segments are parallel to the longitudinal axis of the coil and to one another and are evenly spaced around the cylinder they define with the rings. The section of the coil formed by the inner, evenly spaced pair of conductive rings and the evenly spaced conductive segments connecting them will hereafter be referred to as the "inner structure". Two single-sided high-pass birdcage structures share common rings 56,58 with the inner low-pass structure. Extending between inner rings 56,58 and outer rings 59,60 are conductive segments 52,54. The segments 52,54 are parallel to the longitudinal axes of the coil and to one another and are evenly spaced around the cylinder they define with the rings. The capacitors 62,64 are added in the outer rings 59,60 midway between each ring segment of the conductive segments 62,64 respectively. Each of these "outer structures", resonates at the same frequency and in the same multimode fashion as a conventional high-pass birdcage resonator. Conductive segments 50 of the inner structure and 52,54 of the outer structure are parallel to the longitudinal axis of the resonator and in this embodiment are in line with one another. Input and output coupling to the resonator may be either inductive or capacitive. In FIG. 2b capacitive coupling for circularly polarized operation for the outer structures strongly coupled through the inner structure is accomplished using input/output terminals 51a or 51b, or both, at a selected frequency and input/output terminals 53a or 53b, 1 or both, at the same frequency 90° out of phase. Similarly, capacitive coupling for circularly polarized operation for the inner structure may be accomplished using input/output terminals 57 and 61 at selected NMR frequency but 90° out of phase with one another.

As essential feature, to be described later, is the isolated operation of the inner structure and the outer structure pair. A better understanding of the coil depicted schematically in FIG. 2b can be acquired by study of the lumped-element equivalent circuits of these respective structures shown in FIGS. 3a–3c and 4a–4c and the composite structure formed by joining the structures together seen in FIGS. 5a and 5b. The lumped element inductances are shown as the number of the segment in which they appear with the suffix L, i.e., 52L, 54L, 56L, 58L, or in those cases where a capacitance splits a segment by L and L', i.e., 62L, 62L', 64L, 64L', 66L and 66L'.

Figures 3A, 3C:
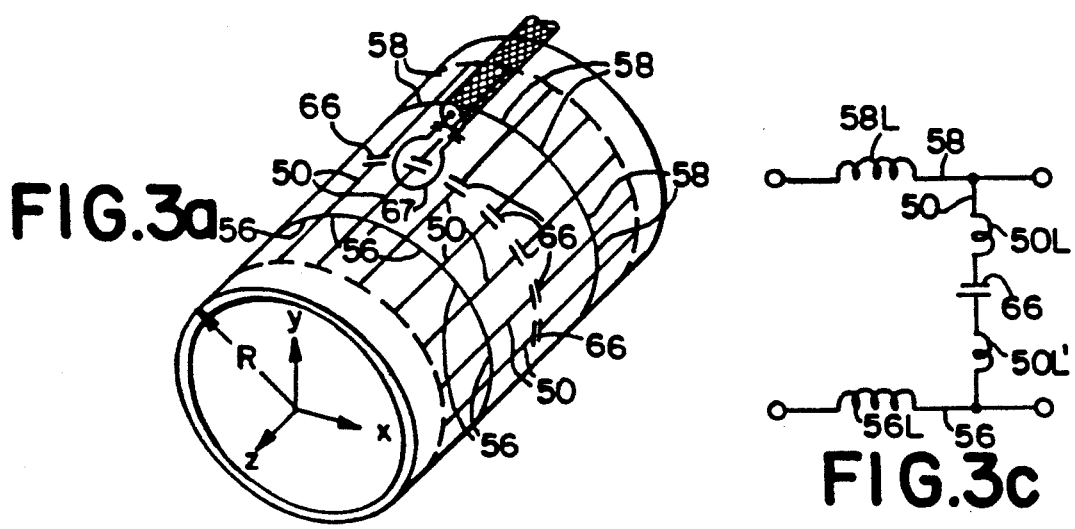
FIG. 3a is a schematic diagram showing for analysis the capacitors of only the loops of the structure of FIG. 2a functioning as a low pass volume resonator capable of operating independently.
FIG. 3c is an individual repetitive circuit unit of the circuit of FIG. 3b.
Figure 3B:
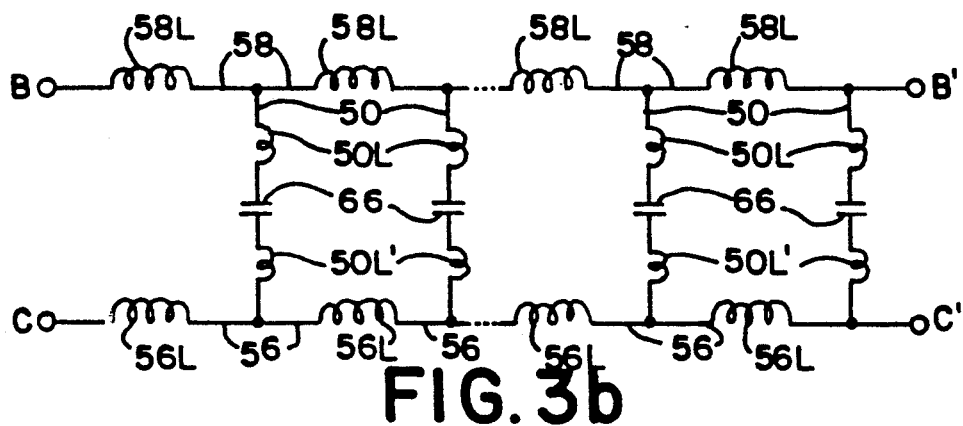

The inner structure of the coil is capable of operating independently as a conventional low-pass "birdcage" resonator by only attaching the capacitors 66 to the inner conductive segments, as indicated in FIG. 3a. This is because no current can flow in the outer meshes, since the outer conductive rings are broken midway between the outer conductive segments. Input/output inductive coupling may be accomplished as shown using a single inductive loop 67 for a linearly polarized operation, or a pair of such loops in quadrature with the inputs 90° out of phase with one another. The inner structure can then be modeled in the usual way as a balanced-ladder network a portion of which is shown in FIG. 3b. The complete circuit of the inner structure is formed in FIG. 3b by joining the points labeled B and C to the points labeled B' and C', respectively. The ladder network is made up of the sixteen repeat circuit units of FIG. 3c. Inductors 56L and 58L represent the inductance associated with each ring segment 56,58 along the conductive ring pair of the inner structure. These inductors are all mutually inductively coupled. Likewise, inductors 50L and 50L' associated with the conductive segments of the inner structure are mutually inductively coupled to each other and to he inductors all the other conductive segments. The network of FIG. 3b is referred to as a "low-pass" structure because of the similarity of the repeat circuit units to a conventional low-pass filter. At a given frequency, there will be a net phase shift $\Delta\phi$ of the voltage through the repeat element. The coil will resonate only when the accumulated phase shift between terminals B-C and B'-C' is an integral multiple of $2\pi$ radians. That is, for a coil with N struts or segments, $N\Delta\phi=k2\pi$. k is referred to the mode number, and for a coil with N struts, where N is an even number, $N/2 \geq k \geq 1$. Modes $k=1$ to $k=(N/2)-1$ have two orthogonal modes associated with each other. Each of these modes are capable of being independently tuned and excited. (See U.S. Pat. No. 4,692,705).

Figure 3D:
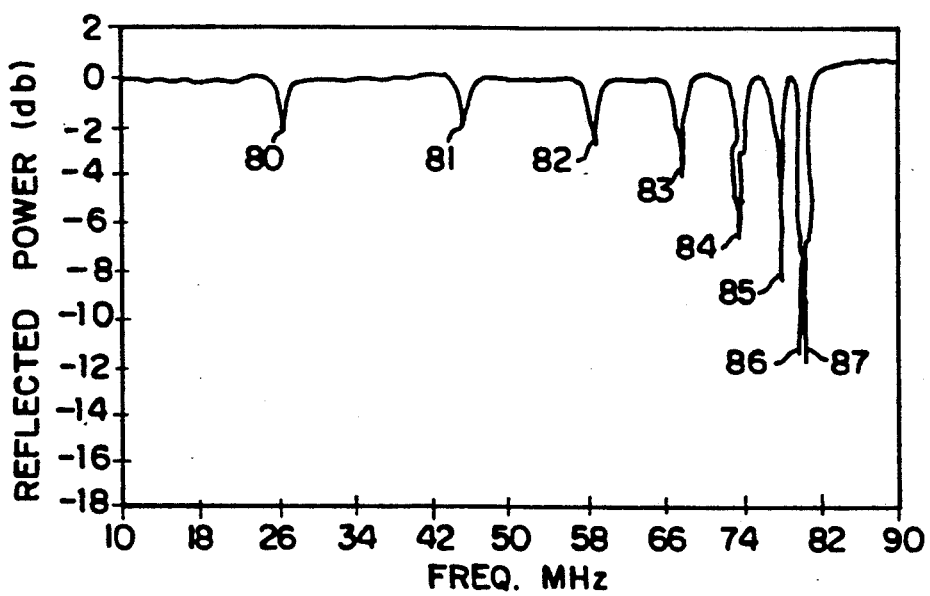

Referring to FIG. 3d, eight modes were measured for a sixteen leg inner low-pass structure using an eight centimeter diameter inductive loop 67 placed over and centered upon one of the capacitors 66. The y-axis is the reflected power from the loop as measured using an impedance bridge and a Hewlett-Packard 4195A network analyzer. Of these modes, only the $k=1$ modes, produce a homogeneous RF $B_1$ field in the region of the coil center. The $k=1$ mode 80 is a quadrature mode, that is, it is in general comprised of two orthogonal "X" and "Y" modes which operate independently and produce respectively about the coil axis sinusoidal and cosinusoidal current distributions in the conductive elements of the coil. The latter produce respectively two linearly oscillating and perpendicular $B_1$ fields in the interior of the coil. The higher order modes occurring at respectively higher frequencies produce increasingly less homogeneous Rf fields, all of which have nulls at the coil center. For a symmetrical coil with identical capacitance values and with equal size and equally spaced conductors, the $k=1$ modes will resonate at the same frequency and will have no preferred spatial orientation. In the usual occurrence of a non-symmetric coil where the capacitors may be slightly unequal in value and the conductor slightly non-uniform, the modes will be linear and spatially orthogonal to one another, will have preferred orientations, and will resonate at slightly different frequencies. See J. Tropp, J. Magn. Reson. 82:51–62 (1989). The coupling 67 shown in FIG. 3a is inductive, with a single inductive coupler suitable for coupling to a single linearly polarized mode of the coil. Coupling to both linear polarized modes of the coil for circularly polarized operation requires two such couplers spaced 90° apart about the coil axis.

Referring to FIG. 4a, each outer structure is capable of operating independently as a "single-sided" high-pass birdcage resonator, where the capacitors 64 are mounted on only one end conductive loop. A single inductive loop 67 positioned as shown will provide linearly polarized operations. In the absence of capacitors 66 and 62, no current will flow in either the inner structure or in the opposite outer structure. The exception occurs with the conductive ring 56 between the inner structure and the opposite outer structure. Being far away, however, the effect of this conductive ring upon the resonant modes of the independently operating single-sided resonator is very small. This has been confirmed by activating the opposite single-ended high-pass resonator with identical capacitors and observing virtually no frequency shifts of the resonant modes. FIG. 4b is the lumped-element equivalent circuit of the single-sided high-pass birdcage resonator shown in FIG. 4a. The ladder network is made up of the repeat circuit units shown in FIG. 4c. The complete circuit of the outer structure is formed by joining terminals A and B to terminals A' and B', respectively. Inductors 60L and 60L' represent the inductance associated with each end conductive ring segment 60 and inductor 58L that of the adjacent inner conductive ring segment 58 shared with the inner structure. These inductors are all mutually inductively coupled. Likewise, inductors 54L associated with the conductive segments 54 of the outer structure are all mutually inductively coupled. The network of FIG. 4b is referred to as a "single-ended high-pass" structure; "single-ended" because capacitors are located only within the outer conductive ring 58, and "high-pass" because of the similarity of the repeat circuit unit with a conventional high-pass filter network. At a given frequency, the voltage through the repeat circuit element will be phase shifted by $\Delta\theta$. The coil of FIG. 4b will, like the inner structure, resonate only when the accumulated phase shift between terminals A—A' and B—B' is an integral multiple of $2\pi$ radians. That is, for a coil with N conductive segments, $N\Delta\theta=k2\pi$, where $N/2>k>1$. The structure of FIG. 4b is equivalent to a "backward wave" transmission line and, unlike the low-pass network of FIG. 3b, will exhibit a decreasing phase shift $\Delta\theta$ for each circuit unit of FIG. 4c with increasing frequency. Higher order modes occur therefore at correspondingly lower frequencies as shown by the reflected power measurements of FIG. 4d. One additional longitudinal mode 98 occurs at high frequency and creates an RF field parallel to the coil axis at the center of the end loop. It originates from the distributed capacitance 64 and the inductance 64L and 64L' of the conductive end ring 60 only. Of these modes, only the $k=1$ linear modes produce a homogeneous RF field in the center of the outer structures. The $k=1$ mode 90 like the $k=1$ mode 80 of FIG. 3d is a quadrature mode and is generally comprised of two orthogonal "X" and "Y" linear modes each of which are capable of producing substantially homogeneous $B_1$ fields in the interior of the coil. Higher order modes ($k>1$) produce inhomogeneous RF fields, all of which have nuls in amplitude along the coil axis of FIG. 4a. For a resonator with N-fold symmetry about the coil axis, that is, a coil having equal size capacitors, equal size and equally spaced conductive segments, equal conductive end ring segments, and equal size conductive inner ring segments, the $k=1$ modes will resonate at the same frequency and will have no preferred orientation. In the usual occurrence of slightly non-symmetric coil, the modes will be linear and spatially orthogonal to one another, will have preferred orientations, and will resonate at slightly different frequencies.

The network of FIG. 5a is the lumped-element equivalent circuit of the resonator invention shown in schematic form in FIG. 2b. The complete circuit of the resonator is formed by joining terminals A, B, C, and D to terminals A', B', C' and D', respectively. The composite balanced ladder network of FIG. 5a is comprised of the repeat circuit units shown in FIG. 5b. With all capacitors attached and all current paths completed, the inner and outer structures of the dual tuned resonator couple via additional mutual inductances and additional circuit connections. Because the inner structure shares common inner ring segments 56 and 58 with the respective outer structures, the mutual inductive couplings between the inner structure and each outer structure are strong. However, because the current paths in the outer ring segments 59 and 60 are interrupted by the high impedance of capacitors 62 and 64 at the lower frequency, the currents at the lower phosphorus frequency are confined primarily to the inner structure. Owing to their increased separation, the end conductive inductors 60L and 60L' are very weakly mutually inductively coupled to the inner ring inductor 56L and the end ring inductors 59L and 59L'; inner ring inductance 58L is very weakly coupled to the end ring inductors 59L and 59L'. Owing also to their separation, inductors 52L and 54L are only weakly mutually inductively coupled to each other. The two outer structures are therefore only weakly mutually inductively coupled. This has been confirmed, as described above, by activating in sequential fashion the two outer structures, installing first capacitors 62 and then 64. No noticeable alteration in the mode structure of FIG. 4d of the first outer structure was observed upon activating the second outer structure. Coupling of the two outer structures therefore occurs through the conductive inner segments 50. At the higher proton frequency, inner segment capacitors 66, which are used primarily to tune the low frequency of the inner structure, have low impedance with respect to the inner segment inductors 50L and 50L'. This has been confirmed for the present embodiment by shorting the capacitors 66 and observing only a slight upward shift in proton frequency. Coupling of the $k=1$ modes of the outer structures is therefore primarily through inner segment inductors 50L and 50L'.

No formal analytic theory exists for a composite birdcage resonator of this type. However, the resonant inner structure and the resonant outer structure pair, which is strongly coupled through the inner structure, operate substantially independently and can be treated as independent resonators, as will be described below. The modes of FIG. 3d were observed with 68 picofarad capacitors used as the capacitor 66 of the inner structure without capacitors in the outer structures. Upon adding 120 picofarad capacitors to both outer structures as capacitors 62 and 64 to activate the dual tuned resonator, 18 discrete resonances were observed. These resonances were observed with reflected power using an 8 cm diameter inductive loop 67 placed over the resonator, such that the coupling loop partially covered both the inner low-pass structure and one of the outer, single-ended high pass structures. Of these modes, eight modes 80,81,82,83,84,85,86,87 were low-pass modes, which was confirmed by placing the loop only over the inner structure. Another eight modes 90,91,92,93,94,95,96,97 were single-ended high-pass modes, confirmed by placing the loop 67 over either outer structure. Mode 98 is the longitudinal mode described earlier. Of the high-pass modes, mode 90 is referred to as the counter-rotating $k=1$ mode; the one extra mode 100 is referred to as the "co-rotating" $k=1$ mode, both of which will be explained below. The entire mode structure of the single ended high pass resonators, with the exception of the: co-rotating $k=1$ mode 100 and the longitudinal mode 98, is compressed between the $k=2$ and $k=3$ modes, 82 and 83, respectively, of the inner low-pass structure. Comparing the positions of the low-pass modes of FIG. 3d with those of FIG. 5c, the effect of activating the outer structures is to shift the $k=1$ mode 80 and $k=2$ mode 81 to slightly lower frequency and $k=3$ mode 82 and $k=4$ mode 83 to slightly higher frequency; $k=5$ to $k=8$ modes 84,85,86,87 are unaffected. Modes 81 and 82 of the inner structure are split for this resonator prototype. Comparing the positions of the high-pass modes of FIG. 4d with those of FIG. 5c, the effect of activating the inner structure is to push $k=4$ to $k=8$ high-pass modes 93,94,95,96,97 to slightly higher frequency without affecting the frequencies of $k=3$ mode 92, $k=2$ mode 91, and the $k=1$ counter-rotating mode 90. The $k=1$ co-rotating high-pass mode 100 appears just below the $k=4$ low-pass mode 83. The substantially independent manner in which the inner structure resonates in the presence of the two outer structures is reflected in the fact that no additional modes were observed with a coupling loop placed over the inner structure. Furthermore, the $k=1$ mode 80 of the low-pass structure was also observed to have only a small downward shift in frequency (0.6 MHz) after adding the 120 picofarad capacitors to the outer structures. The low order high-pass modes 90,91,92 were found not to shift perceptably when the inner structure and opposing outer structure were activated. FIG. 5d is a graph of reflected power response versus frequency for the fully activated resonator with an inductive loop placed at the physical center of the inventive dual tuned resonator. Only two modes are observed; $k=1$ mode 80 for the inner low-pass structure and the "co-rotating" $k=1$ high-pass mode 100. These two modes are the only ones of interest, because they are the only modes with sinusoidally distributed currents about the coil periphery and the only ones therefore to produce highly homogeneous $B_1$ fields in the center of the coil.

With only the outer structures activated, that is, only the outer structures populated with identical value capacitors, resonance patterns are observed which are essentially identical to those of a singly activated outer structure as shown in FIG. 4d. Each structure continues to resonate in an uncoupled manner. Coupling through the inner structure has the strongest effect upon the two degenerate $k=1$ mode pairs of each of the isolated outer structures as shown in FIG. 4a. As shown in FIG. 6a and 6b, these mode pairs are spatially orthogonal to one another and resonate at approximately the same frequency. They have their own initial preferred orientations which reflect the small asymmetries of the respective outer structures. Beginning with very small values, as the values of the inner structure capacitors are increased, the outer resonant structures begin to couple strongly through the inner structure. When the $k=1$ modes begin to over-couple, the mode pairs lock in orientation as indicated in FIGS. 7a and 7b and split in frequency in the same manner as two over coupled resonators. Upon locking in orientation, the new mode pairs span the entire length of the coil, producing the sinusoidally current distributions as illustrated for each mode pair shown in FIG. 8a and 8b, respectively. The modes of FIG. 8a are referred to as the counter-rotating k=1 modes, since the currents in each outer structure have opposite senses. They produce RF fields in the coil having opposite directions. The RF fields of these modes produce a linear gradient in RF intensity along the longitudinal axis and therefore a null in RF field intensity at the center of the coil. This RF field gradient may be useful in rotating frame experiments by providing spatial selectivity in the z-direction. As indicated in FIG. 8a, the sense of the currents in each outer structure is also such as to produce opposing voltages across the inner ring segments 56 and 58. Thus with no currents flowing within the coupling impedances of the inner structure, the counter-rotating k=1 modes have resonant frequencies very close to the k=1 modes of an isolated resonant outer structure. The mode of FIG. 8b is referred to as the co-rotating k=1 high-pass mode, since the currents in each outer structure have the same sense and produce RF fields in the coil having the same direction. As indicated in FIG. 8b, the sense of the currents in each outer structure is such as to produce cooperative voltages across the inner ring segments 56 and 58 causing currents to flow through the inner segments 50 of the inner structure. The intensity of the mesh currents within the inner structure segments 50 will be smaller than those of the outer structure, since the inner structure serves only to couple the outer structures, but they will have the same sinusoidal distribution in intensity as the currents in the outer segments 52 and 54. The effect of currents flowing through the inner structure is to improve the RF field homogeneity in planes through the longitudinal axis. Since the effect of the inner structure is to reduce the inductive impedances of the outer structures, the frequency of this mode is shifted upward from the counter-rotating mode (see M. D. Schnall et al., J. Magn. Reson, 67, 129–134 (1986)). For this embodiment, we have found that the capacitors should be approximately 68 picofarads for the inner structure and approximately 137 picofarads for the outer structure to resonate the dual tuned resonator at 26 MHz for phosphorus nuclei and 63 MHz for hydrogen (1H) nuclei; the respective resonant frequencies for a static field $B_0$ of 1.5 Tesla.

A homogeneous $B_1$ field will produce a more uniform distribution of nutation angles during transmission and, reciprocity, a more uniform receiver response. It is well known that the $B_1$ field of a birdcage resonator can be made more homogeneous in the x-y plane and planes transverse to its longitudinal axis by increasing the number of conductive segments or struts between the end conductive rings. See U.S. Pat. No(s). 4,692,705 and 4,694,255. For the preferred embodiment a sixteen segment coil was chosen to provide adequate RF field homogeneity over the region occupied by the human head. Referring to FIG. 9a, RF field homogeneity in planes through the longitudinal axis of a birdcage resonator increases with the length of the coil. A long coil, however, will acquire increased resistive losses both from the additional length of conductive segments and from increased eddy currents in the sample. The sensitivity of the coil will thereby suffer from reduced circuit Q. The "optimal" geometry employed in the inner structure represents a compromise in $B_1$ field homogeneity to improve the sensitivity of the coil at the lower-frequency, in this case for the phosphorus frequency. The $B_1$ field flux for the k=1 mode of the inner structure is shown in FIG. 9a for the y-z plane. In FIG. 9a it can be seen that while large variations in field intensity occur near the conductive inner rings and segments, the variation is much less in the volume occupied by the sample at the center of the resonator. FIG. 9b shows the $B_1$ field flux for the y-z plane of the coil for the co-rotating k=1 mode 100 shown in FIG. 8b. Because considerably smaller currents flow across the inner segments 50 relative to the currents in the outer segments 52,54, large variations in RF field intensity occur near the coil conductors. It can be seen, however, that the outer structures operate in concert with one another near the center of the resonator, producing a much more homogeneous $B_1$ field in the region occupied by the sample. High quality spin-echo proton images of a human head were obtained with a prototype of the inventive resonator and were found to be as homogeneous as those obtained with a commercial head resonator.

FIG. 10 is a partial developed planar view of a portion of the coil pattern shown in FIG. 2a. The manner in which the physical form of FIG. 2a of the preferred resonator which in complete development has 16 segments, sized and implemented for NMR studies of the head will now be described. The construction of the resonator coil of the invention consisted of the following mechanical steps. Mechanically, the coil is designed to be mounted to a 10.5" o.d. lucite cylinder which is large enough to accommodate most head and nose sizes. The overall distance between the centers of the outer two conductive rings is 25 cm and that of inner two conductive rings is 12.5 cm. Flat metal sheets of 0.0021 inch thick electrically pure copper were used for construction of the conductive coil. The copper sheets were mounted on to a high precision milling machine, where the openings in the meshes for the inner and the two outer structures were cut. High precision milling was used to greatly reduce the tolerances between the adjacent meshes in the inner and outer structures respectively. As shown in FIG. 10, the meshes were cut in such a way that the conductive segments 50 and 52,54 and ring segments 56,58 and 59,60 of both the inner and outer structures were about 0.5" wide. The gaps in the outer ring segments 55 and the middle segments 57 in FIG. 10 represent the slots where capacitors of appropriate values are mounted for tuning the respective structures. Two separate copper metal sheets, each forming one half of the inner structure and one of the outer structures, were then mounted onto 10.5" outer diameter, 0.25" wall thickness lucite cylinder using lexan supports 70, 72 and nylon screws 74 tapped into the lucite cylinder 40 (FIG. 2a). As can be seen in FIG. 10, the trapezoidal supports 70 hold the outer conductive meshes and segments in place and were reinforced by three nylon screws 74. Similarly, the inner structure segments were held by rectangular supports 72, reinforced by two nylon screws 74. The length of the nylon screws were adjusted in such a way that they no longer are a part of the inside cylindrical volume of the resonator.

The terminals A, B, C, and D were electrically connected to terminals A', B', C' and D' in order to make the four conductive rings continuous. To resonate in a static $B_o$ field of 1.5 Tesla, the dual tuned resonator was tuned and aligned to 25.7 Mhz for the phosphorous-31 nucleus and to 63.42 Mhz for the proton nucleus. Procedures for tuning the individual NMR frequencies are the same as those used for tuning a single tuned birdcage resonator. Initially appropriate value and closely identical capacitors were placed in the inner structure slots to tune the inner structure close to phosphorous frequency. Similarly, appropriate and identical value capacitors were placed in the two outer structure slots to tune the coupled outer structures to the proton frequency. low value trimmer capacitors for tuning each of the four linear modes were added across the fixed capacitors 66 and 62,64 of the inner and outer structures at points corresponding to the alignment of the respective low pass and high-pass linear modes. Two additional low-value trimmer capacitors were added at 45 degrees on each side of the tuning capacitors for adjustment of isolation, or mode alignment.

Conventional inductive loop coupling, as well as capacitive coupling, methods maybe used to couple power to and receive signals from the resonator of FIG. 2b. The inductive loop mounting structures were incorporated on the outside of the resonator and were designed in the usual manner taking into account the matching and mode isolation for the individual human head. Couplers mounted over the inner structure couple to k=1 "X" and "Y" modes of the inner structure and couplers mounted over one outer structure couple to either the k=1 co-rotating modes (X and Y) of the K=1 counter-rotating modes of the electrically coupled outer structures. A pair of couplers could also be placed in opposite outer structures to excite modes of the outer structure, providing they were spaced 90° apart about the coil axis. A remote tuning and mode alignment scheme using capacitive coupling to the capacitors 66 has been developed for a phosphorus birdcage resonator of the same size and frequency of the inner structure. See J. Murphy-Boesch et al., Abstract: Society of Magnetic Resonance in Medicine, Eighth Annual Meeting, Vol. 2, p. 944, Society of Magnetic Resonance, Berkeley, Cal., 1989. A similar scheme operating at the proton frequency could be used in tandom with this scheme for differential capacitive coupling to the coil at both frequencies.

Referring now to FIGS. 11, 12, 13 and 14 it will be observed that these figures illustrate alternative ways in which the inventive dual frequency resonator illustrated and discussed above may be implemented. FIG. 11 represents the four ring conductor structure having rings 56 and 58 as inner rings and 59 and 60 as outer rings. As in all the illustrations it will be appreciated that the rings are shown only partially and that they are closed into actual rings by C connecting together terminals A and A', B and B', C and C' and D and D'. Each of the resonator configurations shown in FIGS. 11, 12, 13 and 14 have common ring configurations and each have the same ring designator except that the designators of FIG. 12 have an "a" suffix, those of FIG. 13, a "b" suffix and those of FIG. 14, a "c" suffix. Interconnecting the rings in FIG. 11 are segments generally parallel to the axis of the resonator. Segments 52 interconnect rings 56 and 59. Segments 54 interconnect rings 60 and 58 and segments 50 interconnect rings 56 and 58. As with the rings the interconnecting segments between the rings connecting the corresponding rings together are given the same number designators but with an "a" suffix in FIG. 12, a "b" suffix in FIG. 13 and a "c" suffix in FIG. 14. FIG. 11 also employs a capacitor 66 in element 50 interrupting that element. Similarly each ring element in ring 59 is interrupted by capacitor 62 and each ring element in ring 60 is interrupted by a capacitor 64.

FIGS. 12 and 14 have capacitors in essentially the same paths and are designated with the same number designators but with the suffix "a" in FIG. 12, and "c" in FIG. 14. FIG. 13 has a capacitor 66b interrupting segment 50b, but instead of having a capacitor in the segments of ring 60b, that ring is continuous, as is ring 59b. Capacitors 76 are located in the individual ring segments of ring 56b and capacitors 78 are located in the individual ring segments of ring 58b. As with preferred embodiments of the structure described heretofore as illustrated in FIG. 13, each capacitor 76 in ring 56b is of the same value and each capacitor 78 in each segment of ring 58b is of the same value and in dual frequency co-rotating embodiment similar to that illustrated in FIG. 8b capacitors 76 and 78 have the same value, just as capacitors 62 and 64 do in the co-rotating dual frequency embodiment of FIG. 11 and capacitors 62a and 64a in FIG. 12, and capacitors 62c and 64c in FIG. 14 do in such embodiment.

FIGS. 11-14 are provided to show the versatility of the system considering coils of the same overall dimensions. FIG. 12 shows that unlike FIG. 11 the segments 50a do not have to be lined up with the segments 52a and 54a in order for the structure to function. The circulating currents within an individual loop will remain essentially the same in FIGS. 11 and 12. For similar size coils and identical value capacitors both the structures of FIGS. 11 and 12 resonate at the same NMR frequencies. FIG. 13 presents a somewhat different circulation pattern with the capacitors 76 and 78 moved to the inner rings 56b and 58b, respectively. All circulating current loops in the resonator retain the same sense but require different values of capacitors for producing the same NMR resonant frequencies. The circulation patterns for the low-pass resonator no longer is confined to between rings 56b and 58b, but extend through the outer segments 54 to be sent out to the ring segments 60b and similarly extend out the segments 52b ring segment 59b. Therefore, homogeneous RF $B_1$ field profiles at both NMR frequencies are identical. The circulating current loops in the outer resonators of FIG. 14 retain the same sense but require different values of capacitors for producing the same NMR resonant frequency. The inner loop capacitors retain essentially the same value as those of FIG. 11 to resonate at the same frequency.

The three figures show among other things that repositioning of segments either as in FIG. 11 or in FIG. 12 does not destroy operability. The number of interconnecting segments can even be different in the inner resonator. One example of the above is shown in FIG. 14. The resonators described in the preferred embodiment included sixteen connecting segments for each resonator band. The outer resonators in FIG. 14 include only eight. Although there are advantages in using the sixteen over eight, the structure of FIG. 14 works very well and has been built and demonstrated. At least four generally parallel high frequency current paths connected to each of the adjacent ring paths is required for the structure to to operate in quadrature, otherwise no current path exists for the second quadrature linear mode $B_1$ homogeneity may be improved by increasing the number of such paths in most cases.

If the resonator is to be a dual frequency co-rotating structure capacitors 62 and 64 will have the same value. A triple frequency resonator may be designed using different capacitor values for capacitors 62 and 64 with a different kind of flux distribution, useful for other purposes. Each band can be driven linearly or in circular polarized mode.

It is also possible to have multi-frequency resonators having more than four rings and hence capability of more than three frequencies.

It is well known that increasing the capacitance on opposite sides of a single-tuned birdcage resonator and decreasing the capacitance on the sides in quadrature with the first, such as by superposing a cos $2\phi$ variation in capacitance upon an average capacitance value, will result in two quadrature linear modes tuned to widely separated frequencies. See U.S. Pat. No. 4,694,255 and P. Joseph and D. Lu IEEE Trans. Med. Imaging 8,286–294 (1989). Given its electrical isolation from the outer structure pair, the inner structure could be doubly tuned in this manner to two frequencies, for example to the frequencies of carbon-13 (C-13) and phosphorus-31, to form a triply-tuned resonator. The outer structure pair could remain tuned to the proton frequency, for example, for proton decoupling of both low-frequency nuclei. Similarly, it is contemplated that each of linear modes of the outer structure pair could be tuned to separate frequencies, forming maximally a quadruple resonant coil. A cylindrical resonator of this type is advantageous in that the RF fields at all four frequencies are substantially homogeneous across a cylindrical sample located concentrically in the coil interior. Other modes of operation are contemplated in which the field is less homogeneous within the coil interior. Given the high degree of isolation between the inner structure and any one outer structure, it would be possible to tune each of the three structures to three separate frequencies, when operating the resonator in circularly polarized mode at each frequency or to a maximum of six different frequencies when all structures are operated in linear polarized mode. Operation of the resonator in these various electrical modes in conjunction with various modifications to the form of the coil described above, such as use of the two-fold symmetry of an elipse about the coil axis, will be apparent to those skilled in the art.

Referring to FIGS. 2a and 2b, it will be recognized that the inner conductive rings 56,58 need not be of the same size and shape as the outer conductive rings 59,60. Furthermore, conductive rings 56,58,59,60 need not be precisely circular but may be elipsoidal or of some other geometric form capable of accommodating the sample. By this, it will also be recognized that conductive segments 50 and 52,54 need not be straight or parallel to each other and the longitudinal axis nor need they be equally spaced. It is only necessary that the geometry not render impossible or impractical the desired orientation and tuning of the linear modes of the resonator.

We claim

1. An RF resonator for use in NMR comprising:
at least four axially distributed coaxial high frequency ring current paths;
at least four high frequency current paths interconnecting at least three paris of ring paths, adjacent interconnecting paths forming current loops with connecting segments of ring current paths; and
at least one discrete capacitor interposed in and interrupting each current loop, whereby in combination with the inductance in each loop, including inherent inductance in the conductors, each loop is resonant.

2. The RF resonator of claim 1 in which the resonator has axial symmetry in that the structure in each of the four quadrants around the axis is the same as every other quadrant.

3. The RF resonator of claim 1 in which the resonator has symmetry on both sides of a medial plane normal to the axis of the ring current paths.

4. The RF resonator of claim 2 in which the resonator has symmetry on both sides of a medial plane normal to the axis of the ring current paths.

5. The RF resonator of claim 2 in which the current paths interconnecting each pair of ring current paths are equally spaced from one another.

6. The RF resonator of claim 5 in which the capacitors in all loops between any two ring current paths have essentially the same value.

7. The multiple frequency RF resonator of claim 6 in which four ring current paths are employed and capacitors of no more than three values are employed.

8. The RF resonator of claim 7 in which only two values of capacitors are employed, those of the loops between each of the two outer ring current paths and adjacent ring current paths being the same and the resonator has symmetry on both sides of a medial plane normal to the axis of the ring current paths.

9. The RF resonator of claim 8 in which the inner structure between and including the two inner pair of ring current paths is tuned to one NMR frequency and the two outer structures between and including each of the two outer pairs of ring current paths electrically coupled through the inner structure are tuned to a second NMR frequency.

10. The RF resonator of claim 9 in which input/output couplings positioned over the inner structure between and including two inner ring current paths and spaced essentially 90° apart about the resonator axis can be used to drive the resonator at one NMR frequency in either linearly polarized mode or circularly polarized mode, and input/output couplings positioned over one outer structure between and including an inner ring path and its adjacent outer ring path and spaced essentially 90° apart about the resonator axis can be used to drive the resonator at a second NMR frequency in either linearly polarized mode or circularly polarized mode.

11. An RF resonator for use in NMR comprising:
at least three interconnecting coaxial birdcage coils, each having a pair of ring current paths, adjacent pairs of which are interconnected by at least four high frequency current paths, adjacent birdcage coils sharing the ring current path between them; and
at least one discrete capacitor interposed in and interrupting each current loop, whereby in combination with the inductance in each loop, including inherent inductance in the conductors, each loop is resonant.

12. The RF resonator of claim 3 in which four ring current paths are employed.

13. The RF resonator of claim 11 in which each outer structure between and including an inner ring path and its adjacent outer ring path employs unequal value capacitors and corresponding circumferential position around the resonator and the inner structure between and including two inner ring current paths has identical value capacitors in all its loops.

14. The RF resonator of claim 13 in which input/output couplings positioned over one outer structure between and including an inner ring path and its adjacent outer ring path and spaced essentially 90° apart about the resonator axis can be used to drive the resonator in linearly polarized mode for up to a maximum of two different NMR frequencies and input/output couplings positioned over the inner structure between and including two inner ring current paths and spaced essentially 90° apart about the resonator axis can be used to drive the resonator in linearly polarized mode or in circularly polarized mode at a third NMR frequency.

15. The RF resonator of claim 11 in which each outer structure between and including an inner ring path and its adjacent outer ring path is comprised of unequal value capacitors around the circumference of the resonator and the inner structure between and including two inner ring current paths is comprised of unequal value capacitors.

16. The RF resonator of claim 15 in which input/output couplings positioned over one outer structure between and including an inner ring path and its adjacent outer ring path and spaced essentially 90° apart about the resonator axis can be used to drive the resonator in linearly polarized mode for up to a maximum of two different NMR frequencies, and input/output couplings positioned over the inner structure between and including two inner ring current paths and spaced essentially 90° apart about the resonator axis can be used to drive the resonator in linearly polarized mode and the resonator can be drive for up to a maximum of four separate NMR frequencies in linearly polarized mode.

17. The RF resonator of claim 11 in which the two outer structures between and including an inner ring path and its adjacent outer ring path have identical value capacitance and the inner structure between and including two inner ring current paths has unequal value capacitors in its loops.

18. The RE resonator of claim 17 in which input/output couplings positioned over one outer structure between and including an inner ring path and its adjacent outer ring path and spaced essentially 90° apart about the resonator axis can be used to drive the resonator in linearly polarized mode or in circularly polarized mode at one NMR frequency and input/output couplings positioned over the inner structure between and including two inner ring current paths and spaced essentially 90° apart about the resonator axis can be used to drive the resonator in linearly polarized mode up to a maximum of two separate NMR frequencies.

19. The RF resonator of claim 1 in which four ring current paths are employed and the capacitors in the loops between any two ring current paths do not have essentially the same value as those between any other pair of loops.

20. The RF resonator of claim 19 in which input/output couplings are positioned over each outer structure between and including an inner ring path and its adjacent outer ring path and each coupling pair spaced essentially 90° apart about the resonator axis and input/output couplings positioned over the inner structure between and including two inner ring current paths and spaced essentially 90° apart about the resonator axis can be used to drive the resonator up to a maximum of six different NMR frequencies in linearly polarized modes.

21. A dual RF resonator of generally cylindrical form for use in NMR comprising:
   four high frequency ring current paths;
   a set of at least four generally parallel high frequency current paths connected to each of the adjacent ring paths, adjacent parallel paths and adjacent ring paths forming current loops; and
   at least one discrete capacitor interposed in and interrupting each loop, whereby in combination with the inductance in each loop, including inherent inductance in the conductors, each loop is resonant.

22. The dual RF resonator of claim 21 in which the resonator has axial symmetry in that the structure in each of the four quadrants around the axis is the same as every other quadrant.

23. The dual RE resonator of claim 22 in which the resonator has symmetry on both sides of a medial plane normal to the axis of the ring current paths.

24. The dual RF resonator of claim 21 in which the parallel paths in each set are spaced from one another.

25. The dual RF resonator of claim 24 in which the parallel paths are equally spaced from one another.

26. The dual RF resonator of claim 21 in which the capacitors in inner loops are of a particular capacitance different from capacitors in outer loops, the capacitors having only tow values, whereby all loops between any two ring current paths have the same capacitance and the same resonance such that two selected loops containing differing capacitances are tuned to two separate frequencies.

27. The dual RF resonator of claim 21 in which at least one interconnected pair of ring conductors has capacitors of essentially the same value so that resonances of its loops are at one selected NMR frequency whereby input/output couplings spaced essentially 90° apart about the resonator axis produce a circularly polarized RF magnetic field at that frequency.

28. The dual RF resonator of claim 21 in which at least each of two interconnected pairs of ring current paths has a different frequency from the other but within the respective pairs of ring current paths are capacitors of essentially the same value so that resonances of its loops are at one selected NMR frequency whereby input/output couplings spaced essentially 90° apart about the axis produce a circularly polarized RF magnetic field at that frequency.

29. The dual RF resonator of claim 21 in which at least two of the three interconnected pairs of ring current paths has a different frequency from the other but within the respective pairs of ring current paths are capacitors of essentially the same value so that resonances of its loops are at one selected NMR frequency whereby input/output couplings spaced essentially 90° apart about the axis produce a circularly polarized RF magnetic field at that frequency.

30. The dual RF resonator of claim 21 in which each of at least three interconnected pairs of ring current paths respectively has capacitors of essentially the same value and resonances of its loops at one selected NMR frequency, two of the three pairs located on opposite sides of the third pair have the same frequency and the same number of loops, and two input/output couplings spaced effectively 90° apart about the axis in order to produce a circularly polarized input for each frequency.

31. The dual RF resonator of claim 30 in which the input/output coupling for the outer of the three pairs of ring current paths are arranged with one coupling on one outer pair and the other on the other outer pair such that the current distribution in the outer pairs coupled across the inner pair is co-rotating and both outer pairs are driven in synchronism.

32. The dual RF resonator of claim 21 in which the discrete capacitors are located respectively in each of the generally parallel high frequency current paths between the two inner ring current paths and in the respective outer ring current paths between each of the generally parallel high frequency current paths.

33. The dual RF resonator of claim 21 in which the discrete capacitors are located in each of the generally parallel high frequency current paths between the inner two ring current paths and in each of the two outer ring current paths between each pair of parallel high frequency current paths.

34. The dual RF resonator of claim 21 in which the discrete capacitors are located in each of the generally parallel high frequency current paths between the inner two rings and in each of the outer parallel high frequency current paths interconnecting one inner and the adjacent outer ring.

35. The dual RF resonator of claim 32 in which the parallel high frequency current paths between the two inner ring current paths are aligned with high frequency current paths between outer ring current paths.

36. The dual RF resonator of claim 32 in which the parallel high frequency current paths between the two inner ring current paths are placed between the high frequency current paths between the other ring current paths.

37. The dual RF resonator of claim 32 in which there are fewer parallel high frequency current paths between each of the outer two ring current paths than between the inner pair of ring current paths.

38. The dual RF resonator of claim 38 in which there are half as many parallel high frequency current paths between the respective outer pairs of ring current paths than between the inner pair.

39. The dual RF resonator of claim 38 in which the current paths between the outer rings are aligned with every other current path between the inner ring current paths.

40. A RF resonator of generally cylindrical form for use in NMR comprising:
three adjacent coaxial closed bands of repeated circuits provided by conductors surrounding openings forming electrical meshes, and each of the outer bands sharing a conductor with the inner band;
each of the meshes being formed so that circuits surrounding adjacent meshes in each band share a conductive path and adjacent bands share conductive paths, each circuit around each mesh having at least one discrete capacitor interposed in and interrupting the circuit whereby a selected NMR resonant frequency is achieved in each band by the combination of inductance in the mesh, including inherent inductance in conductors, and the value of capacitance with the resonant frequency of each outer band being different from that of the inner band.

41. The RF resonator of claim 40 in which each of the meshes in each of the bands is substantially identical in width to one another and spaced to provide essentially identical conductor size.

42. The RF resonator of claim 41 in which capacitors are placed in the same relative position circumferentially in each mesh.

43. An RF resonator of generally cylindrical form for use in an NMR comprising:
a thin conductor sheet on a tubular insulating support provided with periodic openings at at least one axial level, all openings at each axial level around the coil being of the same size, such that symmetrical conductive circuits are provided around each of the openings, a gap in the conductor sheet at at least one place around at each opening with a discrete capacitor being provided to span the gap, whereby the capacitance in each loop together with inherent inductance produces resonant frequency circuits together forming a cylindrical resonator having a generally uniform axial field across the inside of the coil.

44. The RF resonator of claim 1 in which the current paths interconnecting each pair of ring current paths are not equally spaced from one another.

45. The RF resonator of claim 1 in which the resonator is not symmetrical on both sides of a medial plane normal to the axis.

46. The RF resonator of claim 1 in which the resonator is not axially symmetrical in all four quadrants.

47. The RF resonator of claim 42 in which periodic openings are provided at three axial levels and gaps in the conductor sheet at at least one place around each opening are provided in symmetrical arrangement with a discrete capacitor being provided to span each gap, the capacitors at the openings in the middle axial level being of different value from other capacitors.

48. The multiple frequency RF resonator of claim 7 in which a different value of capacitor employed between each of three pairs of adjacent ring current paths.

49. The multiple frequency RF resonator of claim 48 in which the resonator can be driven up to a maximum of three NMR frequencies in either linearly polarized mode of circularly polarized mode or in a combination of the above.

50. The RF resonator of claim 7 in which the conductive ring current paths are unequally spaced.

51. The RF resonator of claim 50 in which three values of capacitors are employed and the inner structure between and including the two inner pair of ring current paths is tuned to one NMR frequency and the two outer structures between and including an inner ring current path and its adjacent outer ring current path electrically coupled through the inner structure are tuned to a second NMR frequency.

* * * * *